(12) United States Patent
Paul et al.

(10) Patent No.: US 6,829,187 B2
(45) Date of Patent: Dec. 7, 2004

(54) MEMORY DEVICE

(75) Inventors: Steffen Paul, München (DE); Martin Seifert, München (DE)

(73) Assignee: Infineon Technologies AG, Munich (DE)

( * ) Notice: Subject to any disclaimer, the term of this patent is extended or adjusted under 35 U.S.C. 154(b) by 370 days.

(21) Appl. No.: 10/151,090

(22) Filed: May 20, 2002

(65) Prior Publication Data

US 2002/0196682 A1 Dec. 26, 2002

Related U.S. Application Data

(63) Continuation of application No. PCT/DE00/03873, filed on Nov. 3, 2000.

(30) Foreign Application Priority Data

Nov. 19, 1999 (DE) .......................................... 199 55 779

(51) Int. Cl.$^7$ ................................................ G11C 7/00
(52) U.S. Cl. .................................. 365/205; 365/189.07
(58) Field of Search ............................. 365/189.07, 205

(56) References Cited

U.S. PATENT DOCUMENTS

| | | | |
|---|---|---|---|
| 3,760,194 A | 9/1973 | Lutz et al. ..................... 327/52 |
| 4,978,944 A | * 12/1990 | Andros et al. ............. 340/7.41 |
| 5,039,984 A | * 8/1991 | Andros et al. ............. 340/7.25 |
| 5,487,045 A | 1/1996 | Trodden ................. 365/185.21 |
| 5,703,508 A | 12/1997 | Foss ........................... 327/111 |
| 5,834,953 A | 11/1998 | Glass et al. ................... 327/57 |

FOREIGN PATENT DOCUMENTS

EP 0 747 903 A1 12/1996

* cited by examiner

Primary Examiner—M. Tran
(74) Attorney, Agent, or Firm—Laurence A. Greenberg; Werner H. Stemer; Ralph E. Locher

(57) ABSTRACT

A memory device has a read amplifier with either a variable input resistance and/or the input connections that may be linked to one or both poles of a voltage source using one or more transistors. Additionally, or alternatively the read amplifier is also applied in the decoder devices for choosing the memory cell to he read out or to be written to.

34 Claims, 16 Drawing Sheets

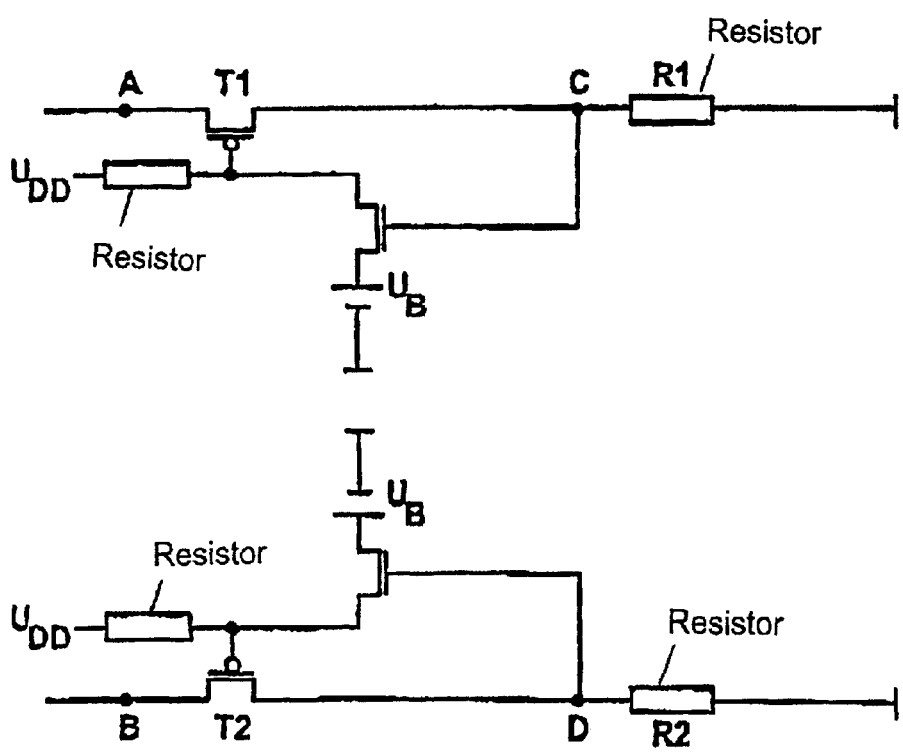
FIG 12
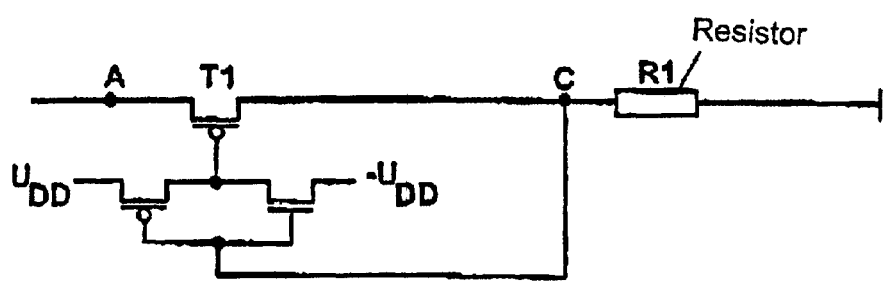
FIG 13
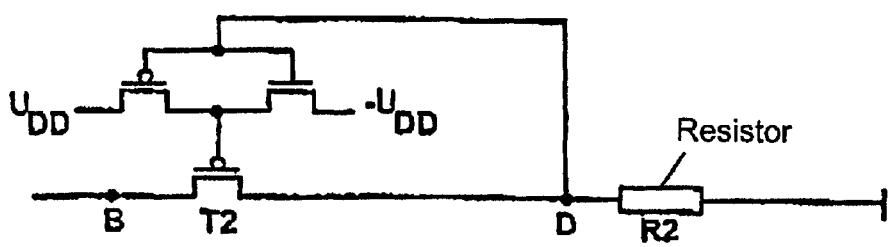

MEMORY DEVICE

CROSS-REFERENCE TO RELATED APPLICATION

This application is a continuation of copending International Application No. PCT/DE00/03873, filed Nov. 3, 2000, which designated the United States and was not published in English.

BACKGROUND OF THE INVENTION

Field of the Invention

The present invention relates to memory devices that include a multiplicity of memory cells for storing data, and a read amplifier enabling the content of the relevant memory cell to be determined by evaluating the magnitude and/or the direction of a current flowing between this cell and the read amplifier during a read-out of the memory cell. In addition, or alternatively, the memory device can include a decoding device exhibiting two or more mutually cooperating decoding units for selecting the memory cell(s) to be read out or to be written to.

Memory devices of this type are, in particular, semiconductor memories such as, for example, RAMs (Random Access Memories), ROMs (Read Only Memories), EPROMs (Erasable Programmable Read Only Memories), EEPROMs (Electrically Erasable Programmable Read Only Memories), and flash memories etc. Such memory devices have been known for many years in numerous embodiments and do not need to be explained in greater detail.

As much as possible, such memory devices and other memory devices are needed to operate at an increasingly faster rate and at the same time to require less and less chip area and consume less and less energy.

To this end, among other things, various improvements in the decoding device provided for selecting the memory cell(s) to be read out or to be written to and improvements in the read amplifier provided for determining the memory cell contents have already been made.

The improvements in the decoding device consist of providing the decoding device, or more precisely the part of it used for selecting memory cell rows, with a so-called pre-decoder and a multiplicity of so-called post-decoders. The pre-decoder carries out a pre-decoding in which it is "only" determined in which memory cell row area (including a number of memory cell rows), the memory cells to be read out or to be written to are located. The post-decoders, which follow the pre-decoder and which in each case are allocated to a particular memory cell row area, determine the particular memory cell row in which the memory cells to be read out or to be written to are located. Such structuring of the decoding device allows the required chip area to be reduced and allows the performance of the decoding device to be enhanced.

The improvements in the read amplifier consist of, among other things, no longer determining the content of a memory cell to be read out on the basis of the voltage that occurs on the bit line during the read-out of the relevant memory cell, but on the basis of the magnitude and/or the direction of the current that occurs between this cell and the read amplifier during the read-out of the relevant memory cell. A determination of the memory cell content based on power flow can be performed more rapidly and with less energy consumption than is the case with a determination based on the voltage.

Due to the aforementioned measures, it was possible to develop chips that are smaller, that manage with less energy, and that operate at a faster rate than was previously the case.

In the meantime, however, it has been found that this is not always the case. Under certain circumstances, the aforementioned advantages cannot be achieved and/or memory chips constructed as described operate unreliably or incorrectly.

SUMMARY OF THE INVENTION

It is accordingly an object of the invention to provide a memory device which overcomes the above-mentioned disadvantages of the prior art apparatus of this general type.

In particular, it is an object of the invention to provide a memory device that they can be implemented to be small under all circumstances, that requires little energy, and that operates reliably and at a rapid rate.

With the foregoing and other objects in view there is provided, in accordance with the invention, a memory device, including: a plurality of memory cells for storing data; and a read amplifier for determining the data of a relevant one of the plurality of the memory cells by evaluating a characteristic of a current flowing between the relevant one of the plurality of the memory cells and the read amplifier. The characteristic is either a magnitude of the current or a direction of the current. The read amplifier having a variable input impedance.

In accordance with an added feature of the invention, the read amplifier has components with dimensions; and the input impedance of the read amplifier can be varied by varying the dimensions of selected ones of the components of the read amplifier.

In accordance with an additional feature of the invention, the read amplifier has components; the read amplifier has a drive for selected ones of the components; and the input impedance of the read amplifier can be varied by varying the drive.

In accordance with another feature of the invention, the read amplifier includes an input and a symmetrically constructed amplifier stage having two identically configured amplifier branches connected to the input.

In accordance with a further feature of the invention, each one of the amplifier branches has a transistor operated in a common-gate configuration and a load resistor following the transistor.

In accordance with a further added feature of the invention, each one of the amplifier branches includes an input and a transistor connecting the input to ground.

In accordance with a further additional feature of the invention, further amplifier branches are constructed complementary to each other. Each one of the further amplifier branches is connected in parallel with a respective one of the amplifier branches at the input.

In accordance with yet an added feature of the invention, the read amplifier includes an input and an asymmetrically constructed amplifier stage having two complementary configured amplifier branches connected to the input.

In accordance with yet an additional feature of the invention, the read amplifier includes an input and an asymmetrically constructed amplifier stage having only one amplifier branch connected to the input.

In accordance with yet another feature of the invention, a further amplifier branch is constructed complementary to the amplifier branch. The further amplifier branch is connected in parallel with the amplifier branch at the input.

In accordance with yet a further feature of the invention, the transistor in each one of the amplifier branches has a gate terminal receiving a voltage acting to vary the input impedance of the read amplifier.

In accordance with yet a further added feature of the invention, the read amplifier has adjustable components; and the voltage applied to the gate terminal of the transistor in each one of the amplifier branches can be varied by adjusting the adjustable components.

In accordance with yet a further additional feature of the invention, coupling branches are provided. Each one of the coupling branches provides a voltage from one of the amplifier branches. The gate terminal of the transistor in each one of the amplifier branches receives the voltage from a respective one of the coupling branches.

In accordance with an added feature of the invention, a voltage divider providing voltages and coupling branches are provided. The transistor in each one of the amplifier branches has a gate terminal. The coupling branches apply a respective one of the voltages from the voltage divider to the gates terminals of the transistors in the amplifier branches.

In accordance with an additional feature of the invention, the load resistor is formed by a CMOS voltage divider.

In accordance with another feature of the invention, the voltage divider is formed by a CMOS voltage divider.

In accordance with a further feature of the invention, the load resistor is constructed to provide various voltages.

In accordance with a further added feature of the invention, the load resistor is formed by a resistor that can be tapped at a plurality of points.

In accordance with a further additional feature of the invention, the load resistor is formed by a diode-connected transistor and a transistor that forms a load resistor; and the transistor that forms the load resistor is connected in series with the diode-connected transistor.

In accordance with yet an added feature of the invention, coupling branches are provided for controlling the transistor in each respective one of the amplifier branches. Each one of the coupling branches includes either an inverting amplifier or a non-inverting amplifier.

In accordance with an additional feature of the invention, the voltage amplifier is formed by a load resistor followed by a transistor operated in a common-gate configuration.

In accordance with another feature of the invention, the voltage amplifier is formed by a load resistor followed by a transistor operated in a common-source connection.

In accordance with a further feature of the invention, the resistor is formed by a transistor.

In accordance with a further added feature of the invention, voltage dividers and coupling branches are provided, and the read amplifier includes an input and an amplifier stage having two amplifier branches connected to the input. The voltage dividers are located between the amplifier branches. The voltage dividers have inversely acting taps. Each one of the amplifier branches has a transistor with a gate terminal receiving a voltage from one of the taps of the voltage dividers.

In accordance with a further additional feature of the invention, the read amplifier includes an amplifier stage that has two amplifier branches. Each one of the amplifier branches includes an input and a transistor that connects the input to ground. The transistor has a gate terminal that receives a voltage from one of the amplifier branches.

With the foregoing and other objects in view there is provided, in accordance with the invention, a memory device, including: a plurality of memory cells for storing data; a read amplifier for determining the data of a relevant one of the plurality of the memory cells by evaluating a characteristic of a current flowing between the relevant one of the plurality of the memory cells and the read amplifier. The characteristic is either a magnitude of the current or a direction of the current. The memory device also includes: a line through which the current flows; and at least one transistor for connecting the line to at least one terminal of a voltage source.

With the foregoing and other objects in view there is provided, in accordance with the invention, a memory device, including: a plurality of memory cells for storing data; and a decoding device having at least two mutually cooperating decoding units for selecting ones of the plurality of the memory cells. At least a first one of the decoding units includes a read amplifier for performing receiving, evaluating, and/or forwarding data from at least a second one of the decoding units or signals from at least the second one of the decoding units.

Accordingly, the novel memory device is distinguished by the fact that:

the input impedance of the read amplifier can be varied; and/or the line through which the current flows is connected to one or both terminals of a voltage source via one or more transistors; and/or the decoding units to which data or signals are transmitted from other decoding units are at least partially equipped with a read amplifier for receiving, evaluating and/or forwarding these data or signals.

As a result, the read amplifier can be excellently matched to the given conditions (particularly to the selection-transistor and bit-line resistances) under all circumstances and/or can also be used for purposes for which no read amplifiers have hitherto been used.

This enables even currents that flow for only a short time and/or very small currents to be reliably detected.

Dispensing with the necessity that currents to be detected must flow for a relatively long time and/or must be relatively large in order to be reliably detected makes it possible to implement memory devices that have a particularly small size, have a low energy requirement, and nevertheless, operate extremely reliably and at a very rapid rate.

Other features which are considered as characteristic for the invention are set forth in the appended claims.

Although the invention is illustrated and described herein as embodied in a memory device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 12–31 show additional embodiments of the read amplifier; and

FIG. 32 shows a decoding device for selecting the memory cell(s) to be read out or to be written to.

DESCRIPTION OF THE PREFERRED EMBODIMENTS

The memory device described in greater detail in the text that follows is an SRAM (Static Random Access Memory). The peculiarities of the memory device described in greater detail in the text which follows can, however, also be used in other memory chips such as, for example, other RAMs, ROMs, EPROMs, EEPROMs, flash memories, and the like.

The memory device considered has a multiplicity of memory cells that are arranged in a matrix in a multiplicity of rows and a multiplicity of columns.

The memory device considered is constructed in CMOS (Complementary Metal Oxide Semiconductor) technology. However, the peculiarities of the memory device considered, which are described in greater detail in the text which follows, can also be applied in memory devices constructed in accordance with other techniques—if necessary after corresponding modification.

In the example considered, there are two bit lines per memory cell column and they can be monitored. Different currents and voltages occur on the bit lines. The read amplifier, with the use of which the content of the memory cell to be read out is determined, monitors both bit lines in the example considered. However, the peculiarities of the memory device considered, which are described in greater detail in the text which follows, can also be applied if only one bit line is present or is taken into consideration—if necessary after corresponding modification.

The memory cell(s) being read out or being written to are defined by an address applied to the memory chip. A decoding device determines which memory cell(s) are designated by this address. Once this has taken place, the relevant memory cells can be read out.

In the example considered, the read amplifier used to determine the content of a memory cell being read out is designed for determining the content of the memory cell being read out on the basis of the magnitude and/or the direction of the current flow that occurs between the memory cell and the read amplifier (on the bit line associated with the memory cell to be read out) during the reading-out of the relevant memory cell.

Figure 1:
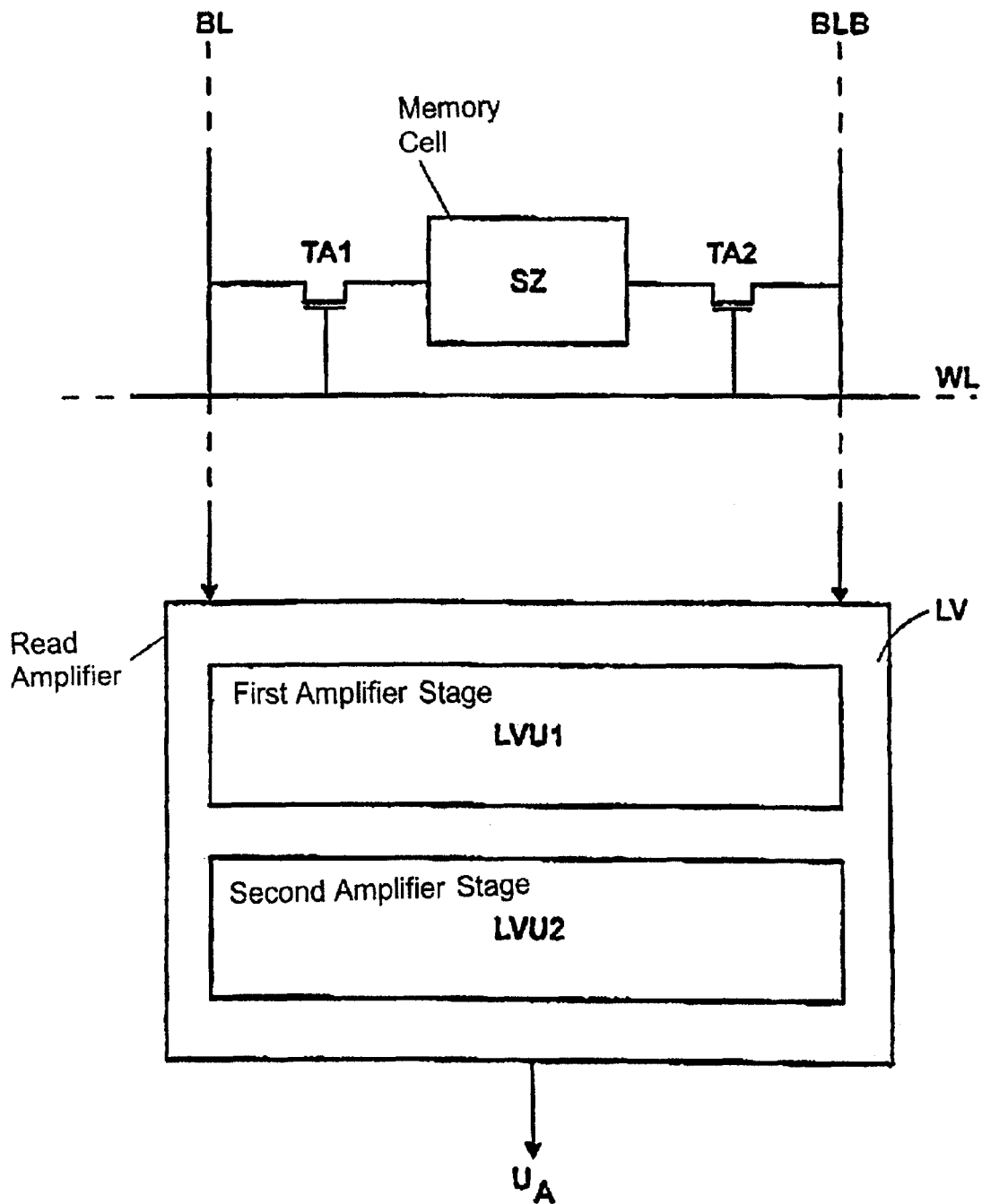
FIG. 1 diagrammatically shows the structure and the interconnection of a memory cell and a read amplifier for reading out the memory cell content.

Referring now to the figures of the drawing in detail and first, particularly, to FIG. 1 thereof, there is diagrammatically shown the structure and the interconnection of a memory cell and of a read amplifier for reading out the memory cell content.

In this case, the memory cell is designated by the reference symbol SZ and the read amplifier is designated by the reference symbol LV.

The memory cell SZ is connected to the read amplifier LV via selection transistors TA1 and TA2 and bit lines BL and BLB.

The selection transistors TA1 and TA2 are driven via an associated word line WL. The word line WL is connected to all memory cells (more precisely to the selection transistors allocated to them) of a memory cell row. The decoding device already mentioned above, but not shown in FIG. 1, applies a voltage to the word line WL. This voltage places the selection transistors in the conductive state (if one or more memory cells are to be read out from the relevant memory cell row), or places the selection transistors into the turned-off state (if no memory cell is to be read out from the relevant memory cell row). The arrangement also contains a column selection device, also not shown in FIG. 1, for determining from which memory cell row, the bit lines BL and BLB are to be monitored by the read amplifier LV (which bit lines are connected to the read amplifier).

In the example considered, the read amplifier LV consists of a first amplifier stage LVU1 and a second amplifier stage LVU2.

The first amplifier stage LVU1 is an input amplifier with an impedance converter. The task of the impedance converter is, in particular, to provide the read amplifier with the lowest possible input impedance (so that the currents on the bit lines which are weak can reach the read amplifier unimpeded). It may prove to be advantageous if the input impedance of the read amplifier becomes negative because the existing selection transistor and bit line resistances can be eliminated, and as a result, the read amplifier can be connected directly to the memory cell to be read out.

The second amplifier stage LVU2 detects the currents flowing on the bit lines BL and BLB, and determines, on the basis of these currents (preferably on the basis of the difference between the currents), the content of the relevant memory cell. The second amplifier stage LVU2 then outputs a signal $U_A$ representing the content of the relevant memory cell. In the example considered, second amplifier stage LVU2 is thus a differential current amplifier with an I/V converter.

A possible structure of such a read amplifier is known from U.S. Pat. No. 5,253,137. However, the read amplifier known from this printed document exhibits the disadvantages mentioned initially.

The read amplifier used in the memory chip considered here differs from the former read amplifier. It is distinguished by the fact that its input impedance can be individually adjusted.

As will be described in detail in the text that follows, this can be achieved, for example, by providing the input of the read amplifier with:

a balanced gate stage amplifier with adjustable voltage feedback or voltage cross-coupling; and/or a balanced gate stage amplifier having an input with two added current sources that can be variably controlled by using voltages picked off from the gate stage amplifier branches.

Of the possibilities mentioned, the first possibility mentioned will first be explained in greater detail with reference to FIGS. 2 to 17. Following this, the second possibility will be explained in greater detail with reference to FIGS. 18 to 24.

Figure 2:
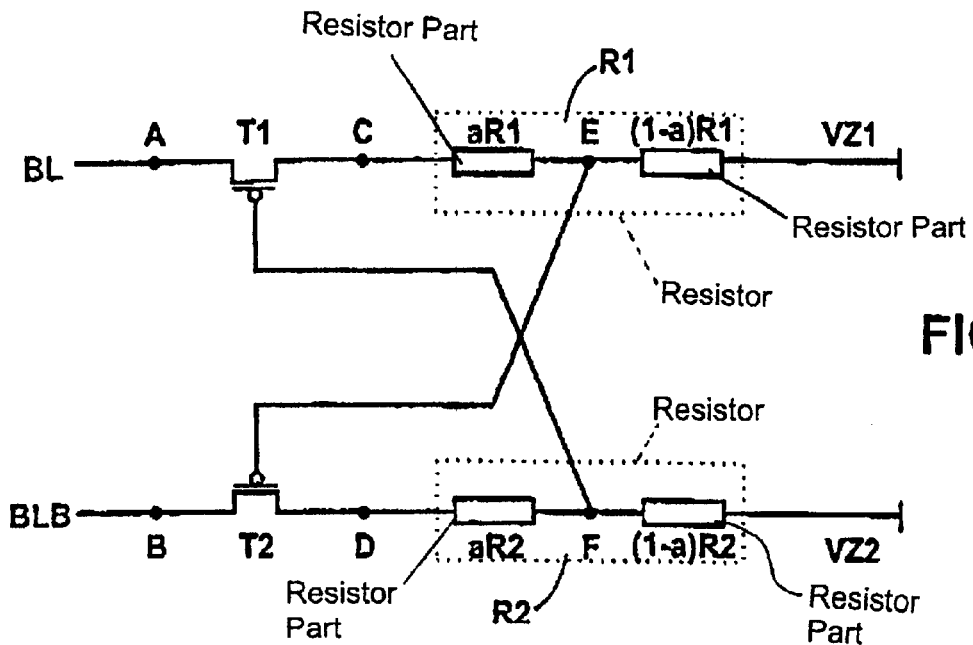
FIG. 2 shows a read amplifier.

The basic structure of an amplifier stage in which the first-mentioned possibility is used is shown in FIG. 2.

The arrangement shown in FIG. 2 is of balanced construction and consists of cross-coupled (amplifier) branches VZ1 and VZ2. Each of the branches contains a PMOS transistor T1 and T2, respectively, and a resistor R1 or R2, respectively, connected in series therewith. The bit lines BL and BLB to be examined are connected to the source terminals of the transistors T1 and T2 (the drains of which are connected to ground via the resistors R1 and R2 in the example considered). In each case, a voltage picked up across the resistor of the other branch is applied to the gate terminal of the respective transistor T1 and T2. The voltages picked up across the resistors (and thus also the extent of the coupling of the branches VZ1 and VZ2) can be changed by varying the tap at the resistors R1 and R2 and/or by varying the resistances or the resistance ratio of the resistor parts aR1 and (1-a)R1 forming resistor R1, and the resistor parts aR2 and (1-a)R2 forming resistor R2. As a result, the input impedance of the arrangement shown in FIG. 2 can be arbitrarily adjusted within certain limits. In this case, it can assume both positive and negative values.

The resistors R1 and R2 can be implemented, for example:
- by tappable linear resistors (for example resistors in thin film or polysilicon construction);
- by connecting a PMOS diode and a PMOS gate stage in series; the input impedance of which can be adjusted via a reference voltage and/or via the dimensioning of the transistor;
- by connecting an NMOS diode and an NMOS source stage in series; the resistance of which can be adjusted via a reference voltage and/or via the dimensioning of the transistor; or
- by a CMOS voltage divider.

Implementing the resistors R1 and R2 using the first-mentioned possibility does not need to be explained in greater detail.

Figure 3:
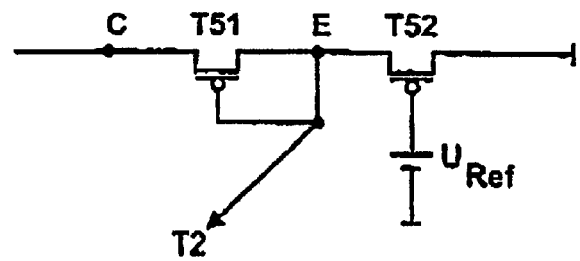
FIG. 3 shows a circuit for implementing the resistors R1 and R2 shown in FIG. 2.

Implementing the resistors R1 and R2 using the second possibility mentioned is particularly suitable in cases in which the resistors R1 and R2 have or are supposed to have a high resistance. This possible implementation is shown in FIG. 3. In this arrangement, the PMOS diode is formed by a correspondingly connected PMOS transistor T51 and the PMOS gate stage is formed by a correspondingly connected PMOS transistor T52. The reference voltage is designated by $U_{Ref}$ and is applied to the gate terminal of the transistor T52.

Figure 4:
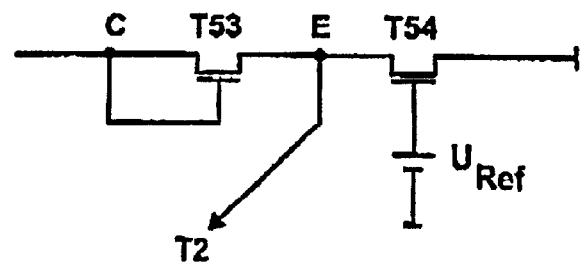
FIG. 4 shows another circuit for implementing the resistors R1 and R2 shown in FIG. 2.

Implementing the resistors R1 and R2 by the third possibility mentioned is particularly suitable in cases in which the resistors R1 and R2 have or are supposed to have a low resistance. This possible implementation is shown in FIG. 4. In this arrangement, the NMOS diode is formed by a correspondingly connected NMOS transistor T53 and the NMOS source stage is formed by a correspondingly connected NMOS transistor T54. The reference voltage is again designated by $U_{Ref}$ and is applied to the gate terminal of the transistor T54.

Figure 5:
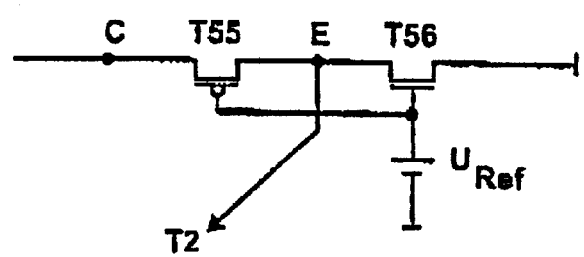
FIG. 5 shows another circuit for implementing the resistors R1 and R2 shown in FIG. 2.

Implementing the resistors R1 and R2 using the last possibility mentioned is illustrated in FIG. 5. In the example considered, it consists of a series circuit of a PMOS transistor T55 and an NMOS transistor T56. A reference voltage $U_{Ref}$ is applied to the gate terminals of the PMOS transistor T55 and the NMOS transistor T56.

In the possible ways of implementing the resistors R1 and R2 of FIG. 2, the voltage applied to the gate terminals of the transistors T1 and T2 is tapped off between the transistors T51 and T52 (FIG. 3), between the transistors T53 and T54 (FIG. 4) and between the transistors T55 and T56 (FIG. 5), respectively. As has already been mentioned above, this voltage can be varied, as has already been mentioned above, by appropriately dimensioning the transistors and/or by varying the reference voltage $U_{Ref}$ (that is to say statically and/or dynamically).

The dynamic variation of the voltage applied to the gate terminals of the transistors T1 and T2 (the variation of this voltage by a variation of the reference voltage) is found to be advantageous because the read amplifier, as a result, can be optimally matched to the conditions prevailing in the memory chip at any time. This makes it possible to ensure that the input impedance of the read amplifier has a desired value under all circumstances and/or does not drop below or exceed a particular value.

The static variation of the voltage applied to the gate terminals of the transistors T1 and T2 (the variation of this voltage by corresponding dimensioning of the transistors) is found to be advantageous because, as a result, it is possible to produce read amplifiers having any input impedances without changing the basic structure of the circuit, that is to say in a very simple manner.

It is particularly when the input impedance of the read amplifier is varied by varying the reference voltage $U_{Ref}$, that the variation of the input impedance of the read amplifier can also be accompanied by a variation of the resistors R1 and R2.

This can be avoided if, in the arrangement shown in FIG. 2, isolation voltage amplifiers V are inserted into the feedback branches via which, the gate terminals of the transistors T1 and T2 are supplied with the voltages picked up across the resistors R1 and R2, respectively. The isolation voltage amplifiers V can be non-inverting amplifiers (gain factor A>0) or inverting amplifiers (gain factor A<0).

Figure 6:
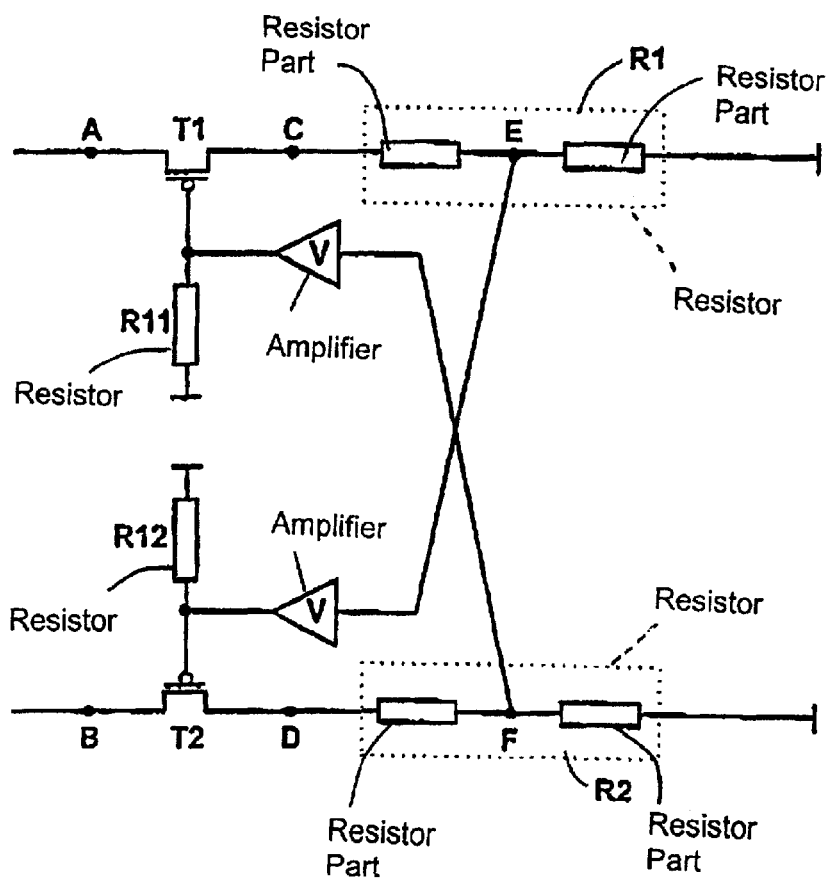
FIG. 6 shows a read amplifier provided with non-inverting amplifiers.
Figure 7:
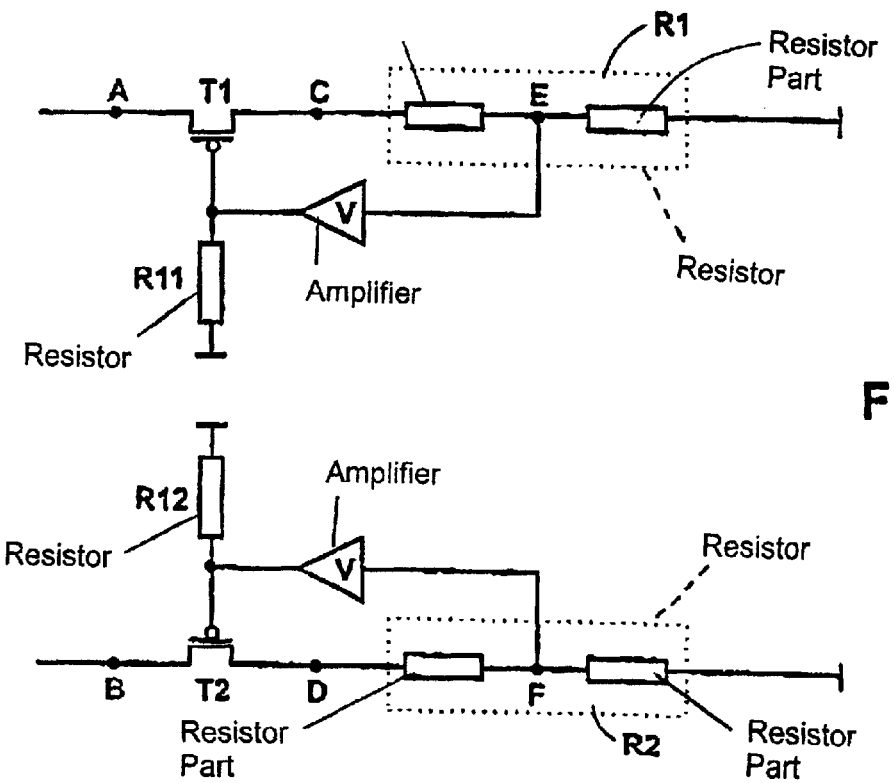
FIG. 7 shows a read amplifier provided with inverting amplifiers.

The construction of an arrangement according to FIG. 2, provided with non-inverting amplifiers V, is shown in FIG. 6 and the construction of an arrangement according to FIG. 2, provided with inverting amplifiers V, is shown in FIG. 7.

In the last-mentioned case, the cross-coupling of the branches VZ1 and VZ2 becomes a "normal" feedback.

Figure 8:
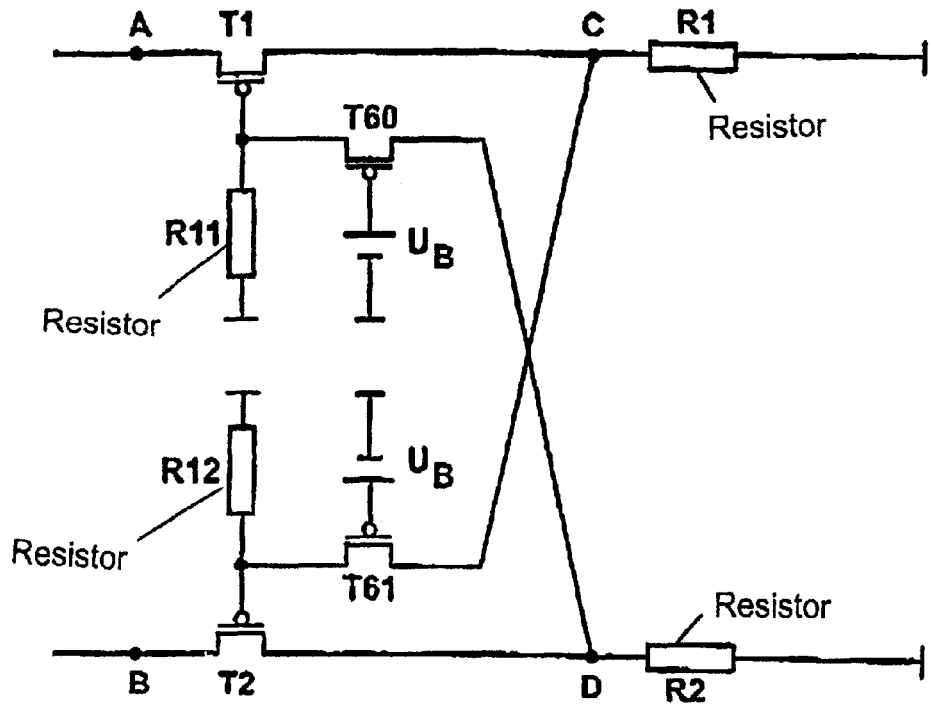
FIG. 8 shows a read amplifier with PMOS transistors.

Using the amplifiers V makes it possible to pick up the voltage to be applied via these to the gate terminals of transistors T1 and T2 in front of the resistors R1 and R2 (see FIG. 8 ff.).

The non-inverting amplifiers V in the cross-coupling or feedback branches can be in each case implemented by a gate stage. In this arrangement, the respective gate stages can be constructed in various manners.

As can be seen from FIG. 8, the gate stages forming the amplifiers can be implemented, for example, by using PMOS transistors T60 and T61, respectively. The source terminal of each PMOS transistor T60 and T61 is connected to a branch VZ2 and VZ1, respectively. A voltage $U_B$ is used for adjusting the operating point applied to the gate terminals of the PMOS transistors T60 and T61. The drain terminal of the respective PMOS transistor T60 and T61 is connected to the gate terminal of the transistor T1 and T2, respectively, and is connected to ground via resistors R11 and R12.

Figure 9:
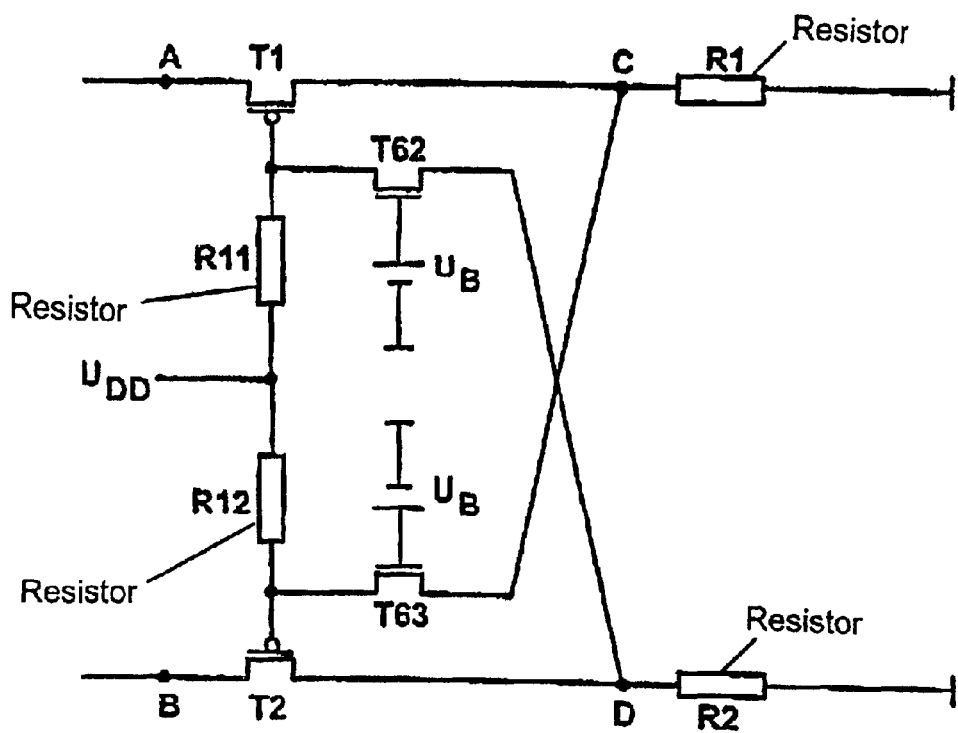
FIG. 9 shows a read amplifier with NMOS transistors.

As can be seen from FIG. 9, the gate stages forming the amplifiers can also be implemented by using NMOS transistors T62 and T63 (the source terminals are connected to the branches VZ1 and VZ2, respectively, a voltage $U_B$ used for adjusting the operating point is applied to the gate terminals, and the drain terminals are connected to the gate terminal of a respective transistor T1 and T2 and to the supply voltage $U_{DD}$ via resistors R11 and R12).

Figure 10:
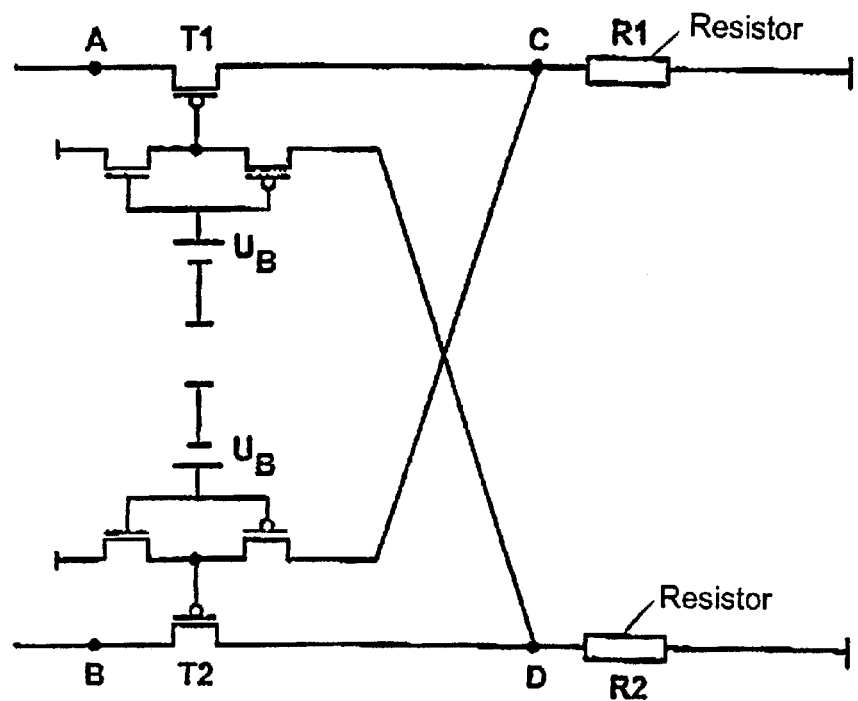
FIGS. 10 and 11 show embodiments of the read amplifier constructed using CMOS technology.
Figure 11:
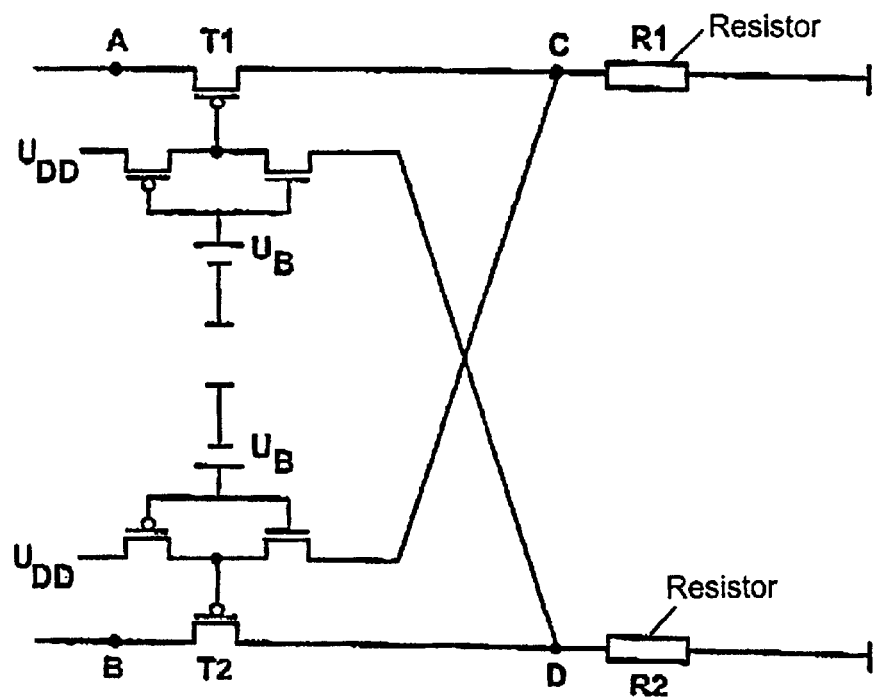

The gate stages forming the amplifiers can also be constructed in CMOS technology. This is illustrated in FIGS. 10 and 11. The arrangement shown in FIG. 10 corresponds to the arrangement shown in FIG. 8, and the arrangement shown in FIG. 11 corresponds to the arrangement shown in FIG. 9.

When amplifiers are used in the cross-coupling branches according to FIG. 6, a change in the gain of the amplifiers V also influences the resistors R1 and R2 via the input impedance of the read amplifier. However, this influence on the resistors R1 and R2 is much weaker than in the case of read amplifiers of the type of FIG. 2.

This influence disappears completely when the arrangement according to FIG. 7 is used because the amplifiers V contained therein are connected non-reactively to the resistors R1 and R2 or, respectively, to taps of these, especially if they are formed by a source stage (see FIG. 12) or by a CMOS inverter (see FIG. 13).

This allows high-resistance resistors R1 and R2 to be used as a result of which the transistors T1 and T2 can have particularly high voltage gains.

Figure 14:
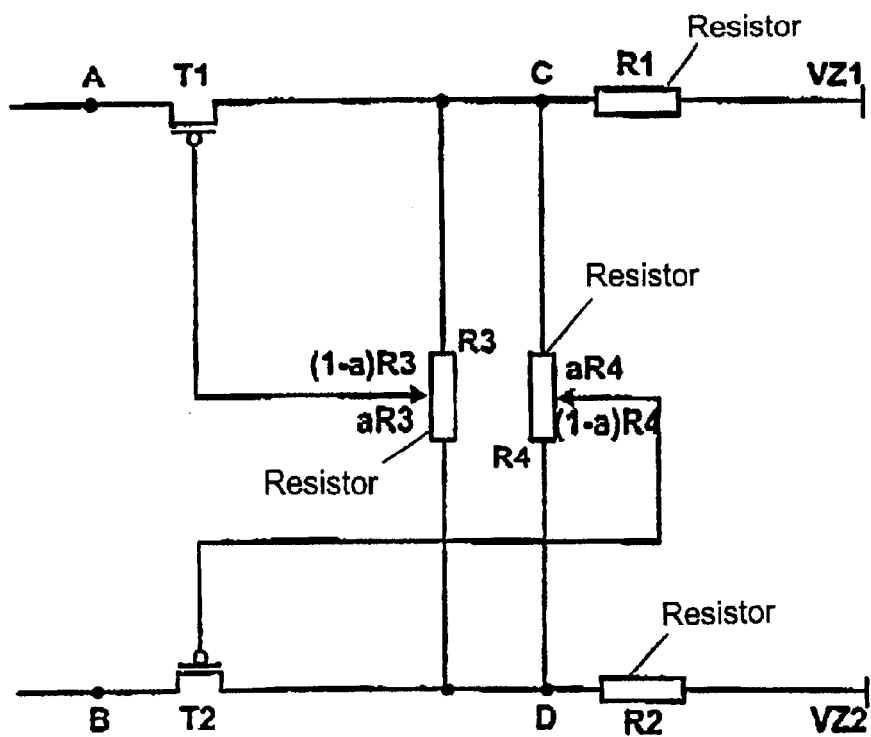

Another possibility for adjustable voltage feedback and/or cross-coupling is illustrated in FIG. 14. In this arrangement, the voltage applied to the gate terminals of the transistors T1 and T2 is picked up at resistors R3 and R4 (R3 R4), or more accurately at inversely acting taps of these, provided between the branches VZ1 and VZ2 (in this case between the drain terminals of the transistors T1 and T2).

The inversely acting dual voltage divider according to FIG. 14 can be formed, by example, by connecting three resistors (e.g. formed by MOS transistors) in series with two intermediate taps.

Figure 15:
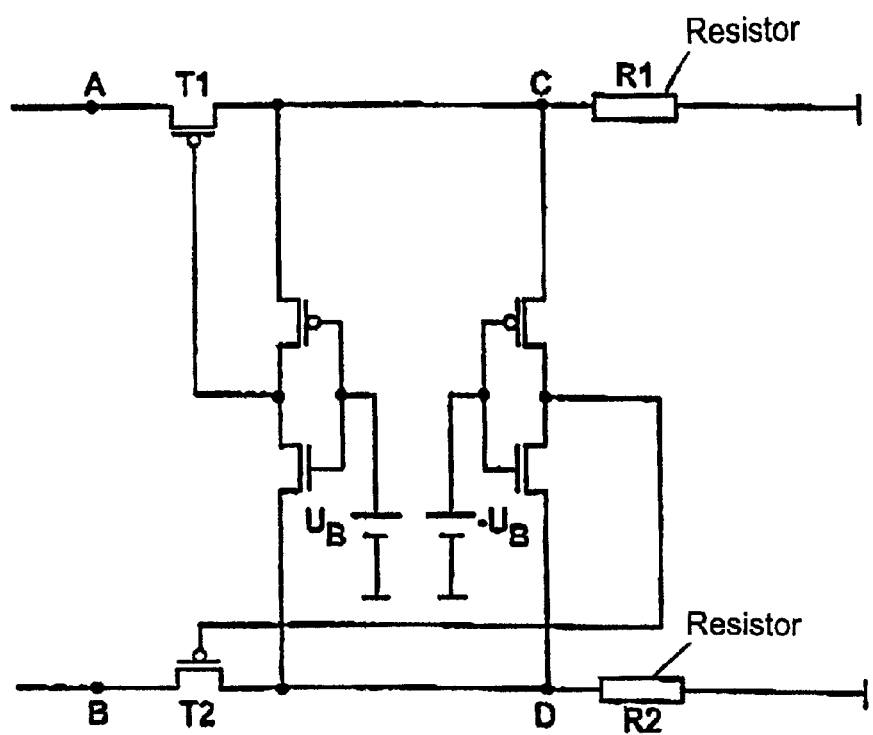

Another possibility for implementing the inversely acting dual voltage divider according to FIG. 14 consists in providing a dual CMOS voltage divider with adjustable opposite-polarized auxiliary gate bias. Such an arrangement is shown in FIG. 15.

Figure 16:
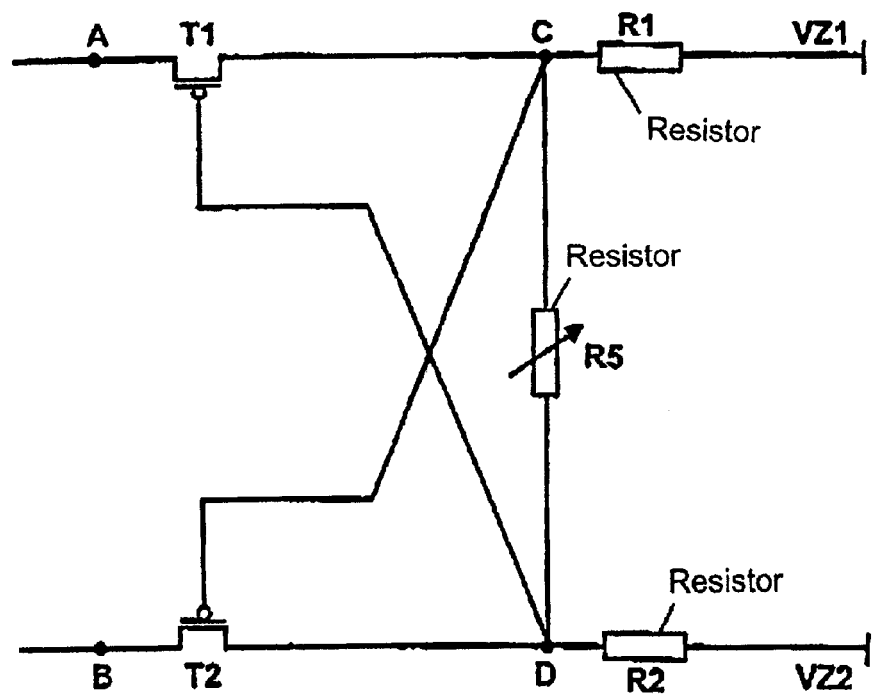

In the case where the parameter "a" in the arrangement according to FIG. 14 assumes the value 1, the arrangement according to FIG. 14 can be implemented by the arrangement according to FIG. 16. The resistor R5, which is provided instead of the resistors R3 and R4 in this arrangement, can be implemented, for example, as a voltage-controlled MOS resistor.

Figure 17:
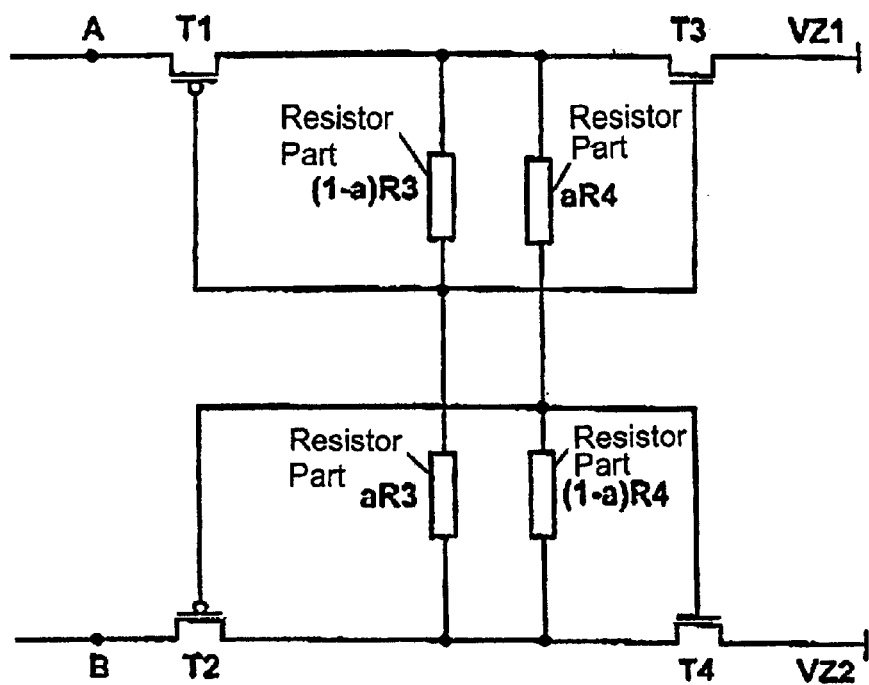

A particularly simple arrangement is obtained if the resistors R1 and R2, which are provided in the branches VZ1 and VZ2, are implemented by NMOS transistors T3 and T4, respectively. The gate terminals of which are connected to the gate terminals of the transistors T1 and T2. This is shown by way of example in FIG. 17. The arrangement shown in FIG. 17 is a result of a modification of the arrangement shown in FIG. 14, which was made as mentioned.

The above explanations made with reference to FIGS. 2 to 17 referred to a read amplifier in which the adjustability of its input impedance was achieved by providing a balanced gate stage amplifier with adjustable voltage feedback or voltage cross-coupling at its input.

As has already been mentioned initially, adjustability of the input impedance of the read amplifier can also be achieved by providing the input of the read amplifier with a balanced gate stage amplifier having an input to which two current sources are added. The current sources can be variably controlled by using voltages tapped off from the amplifier branches VZ1 and VZ2.

In the text that follows, the second possibility will be explained in greater detail with reference to FIGS. 18 to 24.

The balanced gate stage amplifier again consists of two amplifier branches VZ1 and VZ2, each of which contains a PMOS transistor T1 and T2, respectively, and a resistor R1 and R2, respectively, connected in series therewith. To this extent, there is no difference from the read amplifiers of the type described before. However, the inputs of the branches VZ1 and VZ2 are connected to controllable current sources. In the example considered, these current sources are implemented by MOS transistors which operate either in a common-source connection or in a common-drain connection. The input impedance of the arrangement can be freely adjusted within certain limits by appropriately controlling the current sources.

Figure 18:
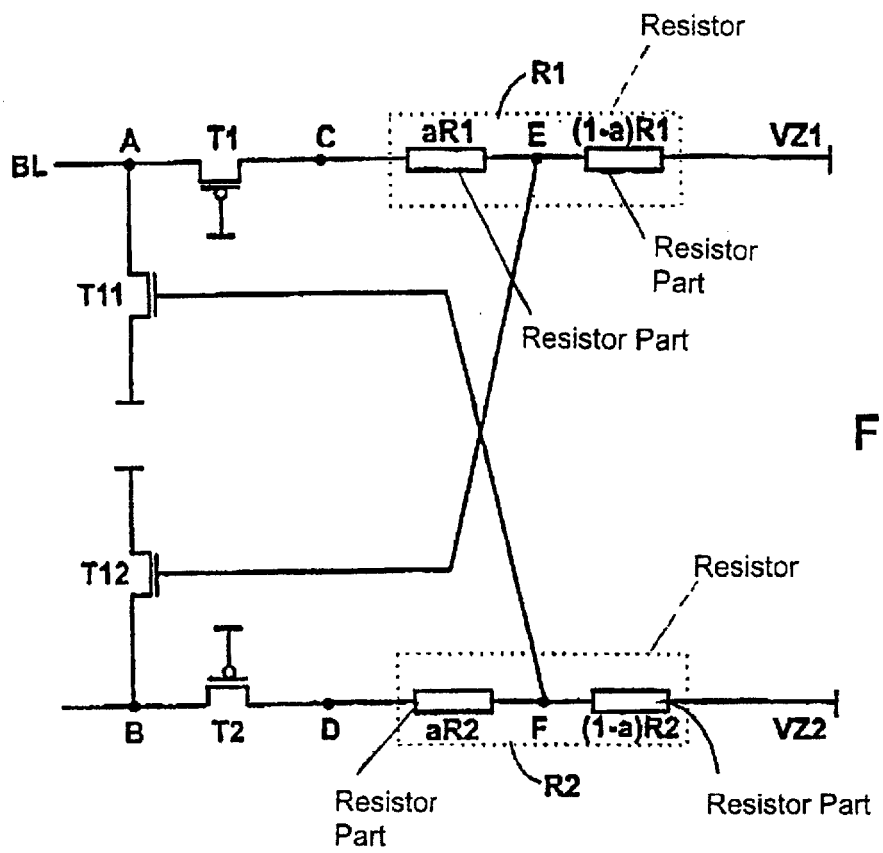

Such an arrangement is shown in FIG. 18. The bit lines BL and BLB to be examined are connected to the source terminals of the resistors T1 and T2 (the gates of which, in the example considered, are connected directly to ground and the drains of which are connected to ground via the resistors R1 and R2). The current sources, which are connected to the inputs of the branches VZ1 and VZ2, are formed by NMOS transistors T11 and T12 operating in common-source connection. The source terminals of these transistors T11 and T12 are connected to ground and the drain terminals are connected to the source terminals of the transistors T1 and T2. The gate terminals of the transistors T11 and T12 are supplied with a voltage picked up at the resistor R2 or R1 of the other branch. The voltages picked up at the resistors R1, R2, and thus also the currents flowing through the transistors T11, T12 can be varied by varying the tap at the resistors R1 and R2 and/or by varying the resistances or the resistance ratio of the resistor parts aR1 and (1-a)R1 forming resistor R1 and of the resistor parts aR2 and (1-a)R2 forming resistor R2. As a result, the input impedance of the arrangement shown in FIG. 18 can be arbitrarily adjusted within certain limits.

Figure 19:
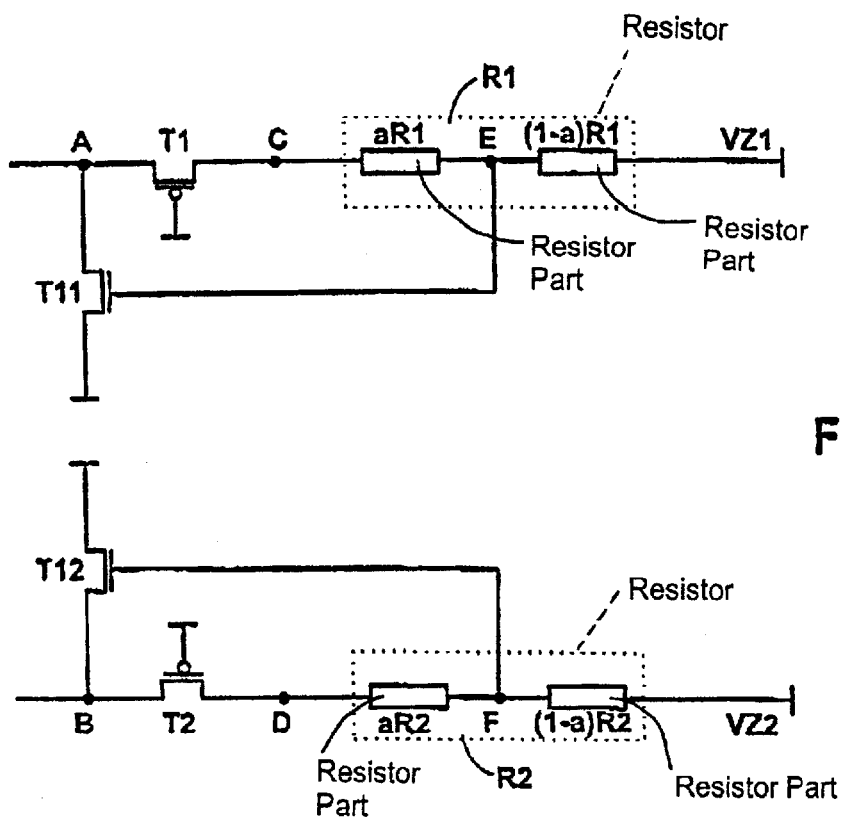

The gate terminals of the transistors T11 and T12 can also be supplied with a voltage that is picked up at the resistor in the branch to which the transistor T11 and T12 is connected. This is illustrated in FIG. 19.

The resistors R1 and R2 at which various voltages can be picked up can be formed, for example, by any of the arrangements shown in FIGS. 3 to 5. The voltages that are applied to the gate terminals of the transistors T11, T12 can also be picked up from (transverse) voltage dividers arranged between the branches VZ1 and VZ2 as shown, for example, in the arrangement in FIG. 14.

Figure 20:
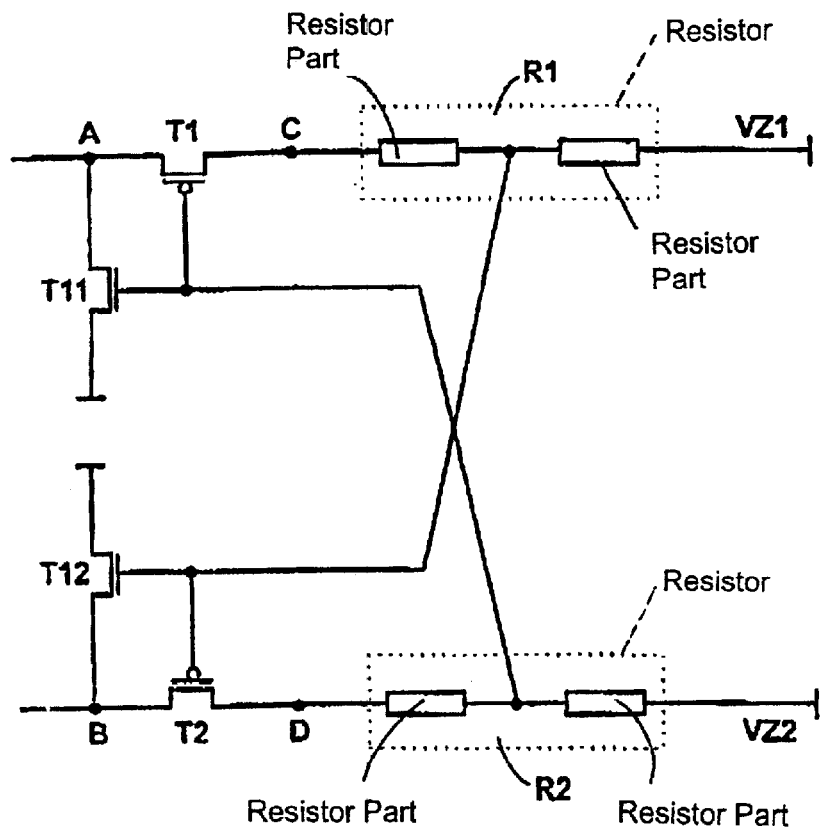
Figure 21:
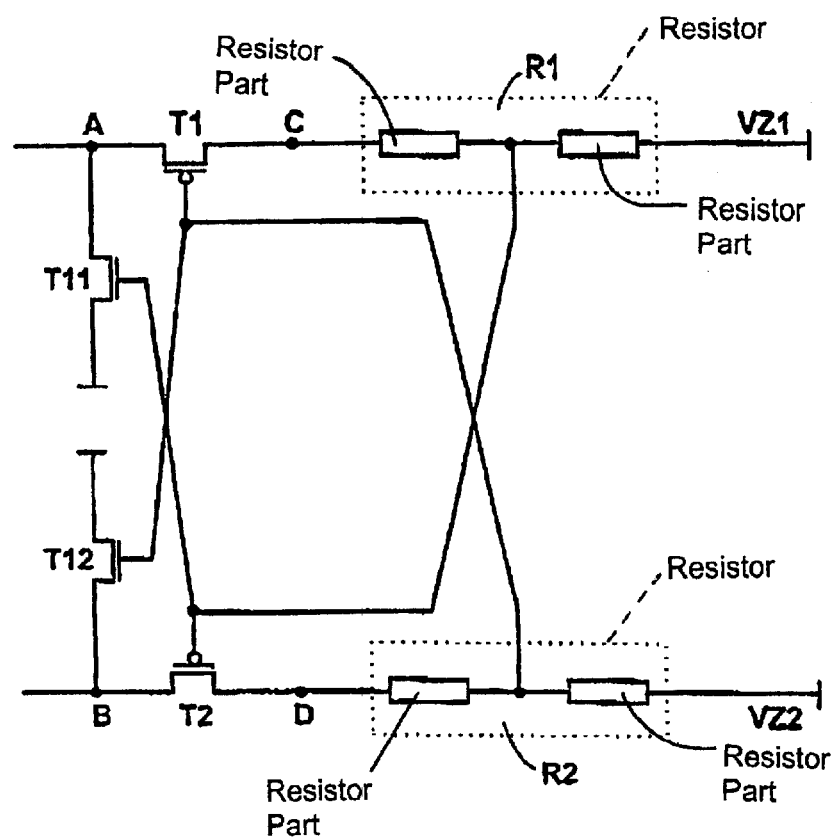

It is also possible to connect the gate terminals of the transistors T1 and T2 and the gate terminals of the transistors T11 and T12 as shown in FIGS. 20 and 21. The arrangement shown in FIG. 21 is found to be particularly advantageous because this makes it possible to vary the input impedance between very small positive values and negative values.

Figure 22:
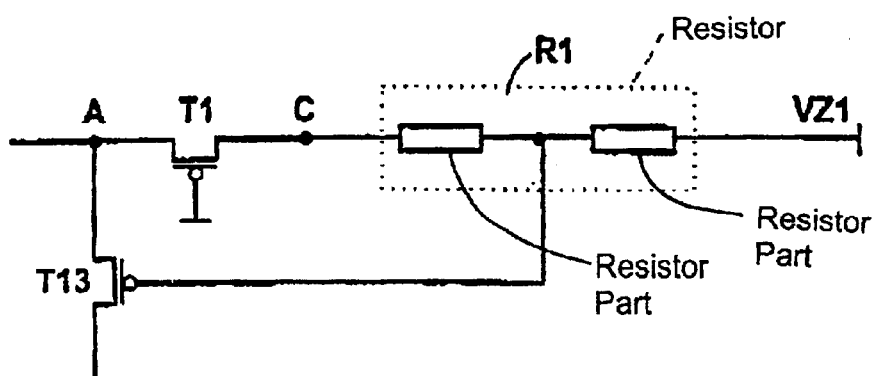

As has already been mentioned above, the current sources formed by the transistors T11 and T12 can also be implemented by transistors operating in a common-drain connection. FIG. 22 shows an arrangement in which this has been practiced. The transistors forming the current sources are the transistors T13 and T14 and these are PMOS transistors. The source terminals of transistors T13 and T14 are connected to the branches VZ1 and VZ2. The drain terminals of transistors T13 and T14 are connected to ground. The gate terminals of the transistors T13 and T14 are supplied with voltages that are picked up at the resistors R1 and R2.

In FIG. 22, the voltages that are applied to the gate terminals of the transistors T13 and T14 are in each case picked up at the resistors that are located in the branch to which the relevant transistor is connected.

The arrangement shown in FIG. 22 can be modified such that the gate terminals of the transistors T1 and T2 are not connected to ground, but have voltages applied to them that are picked up from the other branch in each case. Such an arrangement is shown in FIG. 23.

Figure 23:
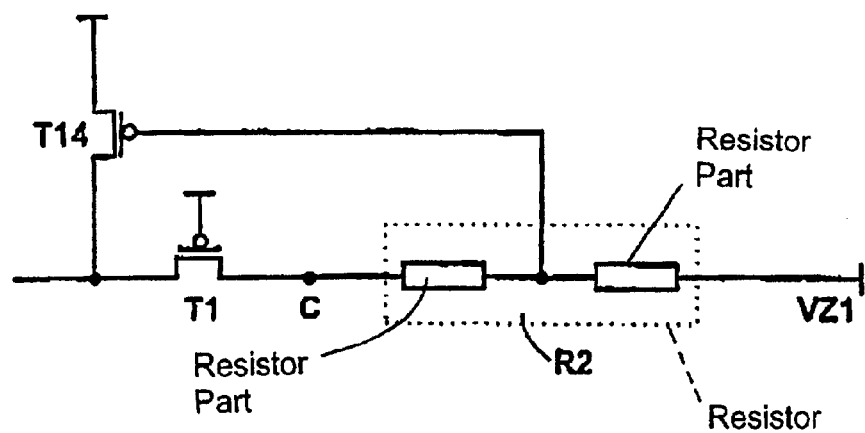
Figure 23:
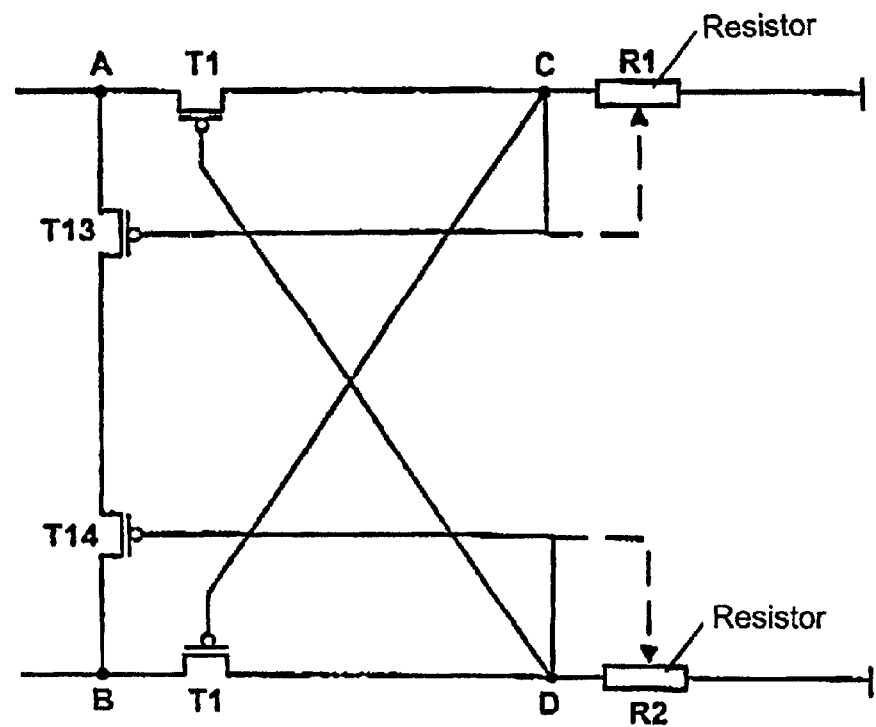
Figure 24:
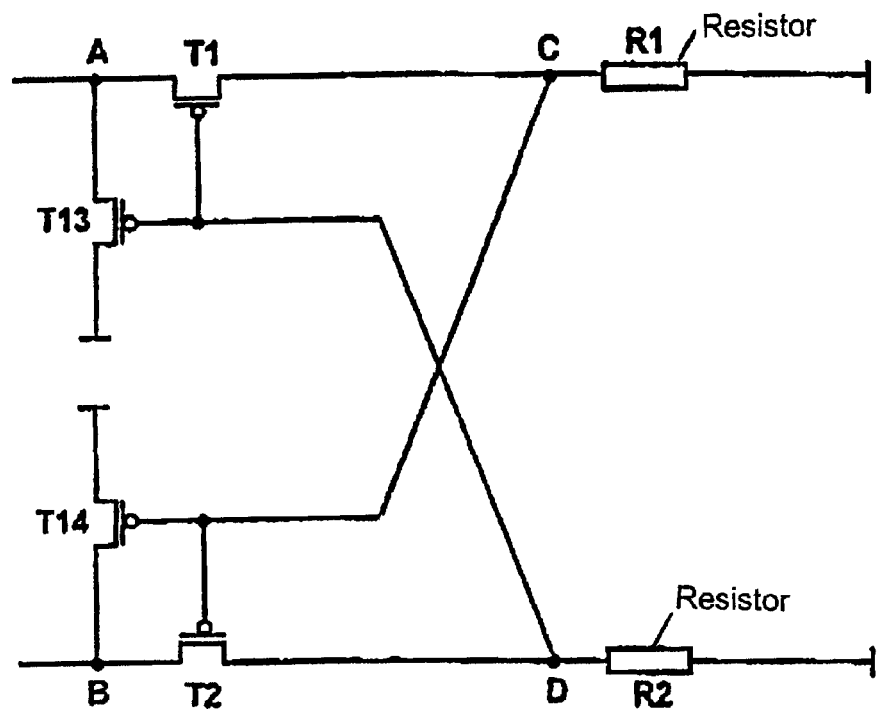

The arrangement shown in FIG. 23 can be modified by also supplying the voltage, which is supplied to the gate terminal of the transistor T1, to the gate terminal of the transistor T13. In addition, the voltage, which is supplied to the gate terminal of the transistor T2, is also supplied to the gate terminal of the transistor T14. Such an arrangement is shown in FIG. 24.

The arrangements described above with reference to FIGS. 2 to 24 can be further modified at least partially.

Figure 25:
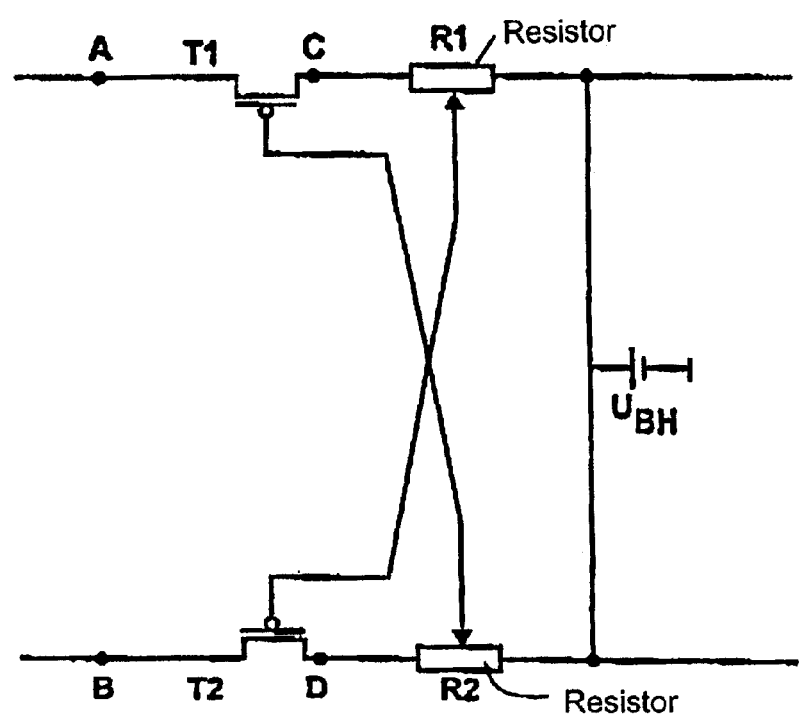

It is thus possible to apply an auxiliary voltage $U_{BH}$ to the output of the branches VZ1 and VZ2 (instead of connecting them to ground as shown in FIGS. 2 to 24). An exemplary embodiment of such an arrangement is shown in FIG. 25. The voltage $U_{BH}$ can be a voltage which can be adjusted statically or dynamically. The voltage $U_{BH}$ allows the operating points of the branches VZ1 and VZ2 to be changed as desired.

Figure 26:
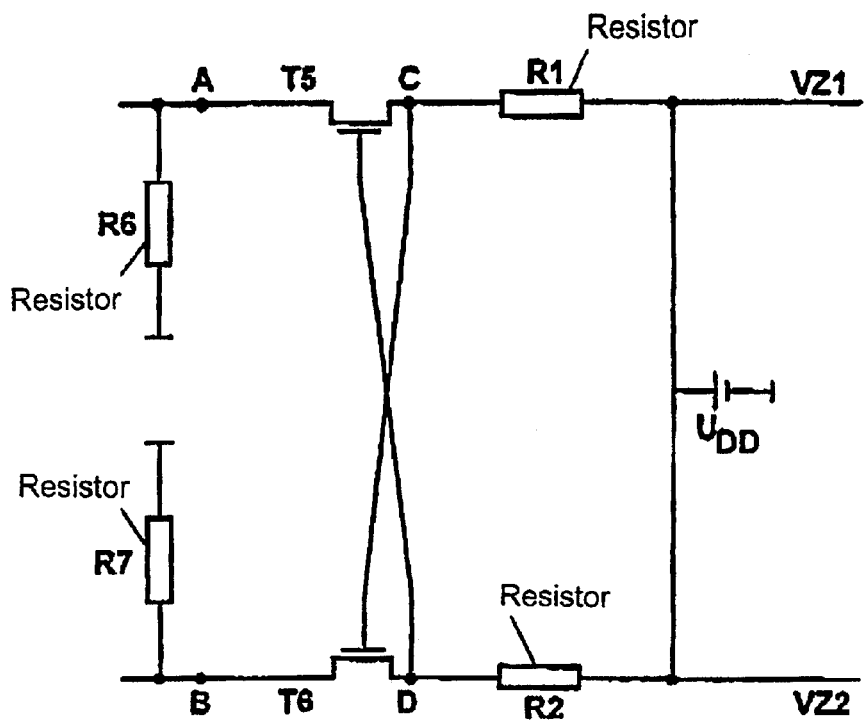

Furthermore, there is also no restriction that the branches VZ1 and VZ2 must include a p-channel input gate stage and a resistor connected in series. The folded complementary gate input stage can also be used. The bit lines operate on load elements or resistors R6 and R7 of the bit line, which can also be current sinks. The inputs of the NMOS transistors T5 and T6 forming the complementary gate stage are then connected to the resistors R6 and R7 and the resistors R1 and R2 are connected to the supply voltage $U_{DD}$. An arrangement of this type is shown in FIG. 26. The example shown is a modification of the arrangement shown in FIG. 2. If necessary, the resistors R6 and R7 can be compensated for by using a negative input impedance of the read amplifier like the bit line and selection transistor resistors. The methods shown in FIGS. 2 to 24 and described with reference to these can also be used for varying the input impedance in arrangements of the type shown in FIG. 26. If necessary, additional and/or other auxiliary voltages or reference voltages must be provided for suitable operating point adjustments.

Figure 27:
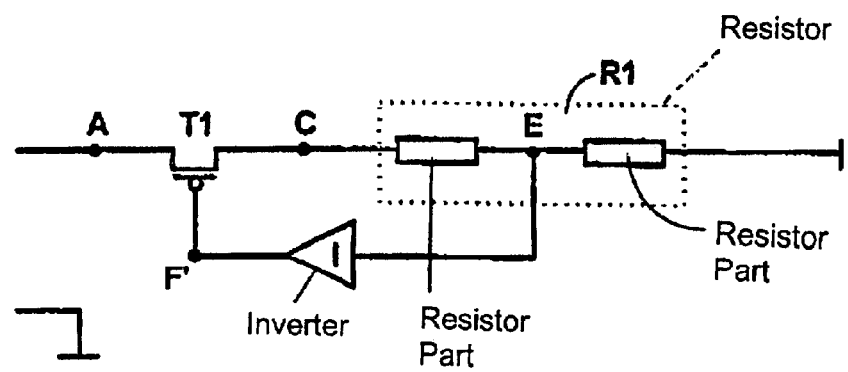

The principle of varying the input impedance from positive values through to negative values by using variable feedback can also be used in unbalanced arrangements. The phase angle of the feedback voltage, obtained by the circuit symmetry in balanced arrangements, may then have to be reproduced at mirrored network nodes, which can be done, for example, by using inverting voltage followers (inverters). The balanced arrangement shown in FIG. 2 can thus be changed into the unbalanced arrangement shown in FIG. 27 by using an inverter I. The voltage occurring at node F' in FIG. 27 corresponds to the voltage occurring at node F in FIG. 2.

Figure 28:
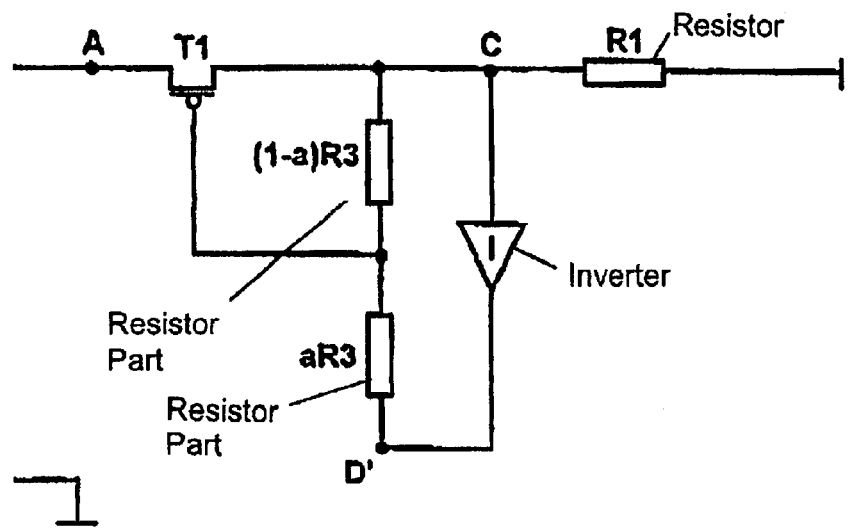

The balanced arrangement shown in FIG. 14 can also be changed into an unbalanced arrangement by using an inverter I. The corresponding unbalanced arrangement is shown in FIG. 28. The voltage occurring at node D' in FIG. 28 corresponds to the voltage occurring at node D in FIG. 14.

According to this principle, the other arrangements previously described can also be changed into unbalanced arrangements.

Figure 29:
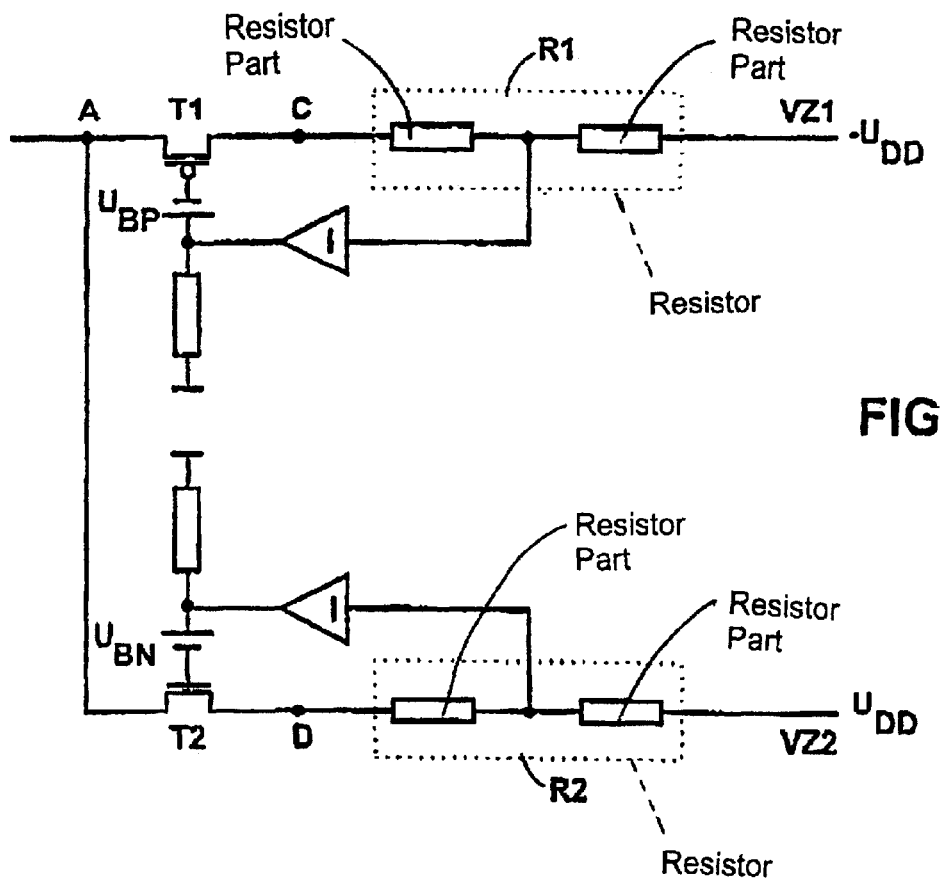
Figure 30:
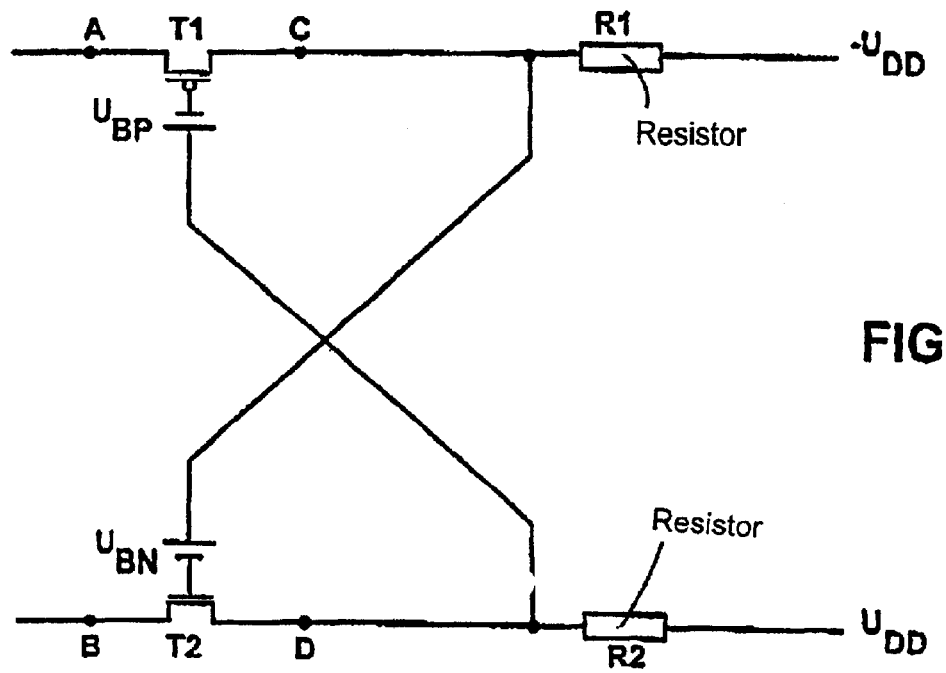

The asymmetry of the arrangement can also consist in differently constructing the branches VZ1 and VZ2 (for example, providing mutually complementary transistors). The input impedance can also be varied in such arrangements. Two exemplary embodiments of possible practical implementations of arrangements of this type are shown in FIGS. 29 and 30.

Using unbalanced read amplifiers constructed as described or differently constructed is found to be advantageous particularly for processing bipolar signals.

The arrangements described above with reference to FIG. 2 to have an input impedance that can be varied or adjusted in a very simple manner statically (by correspondingly dimensioning certain components) and/or dynamically (by correspondingly adjusting or correspondingly operating particular components).

However, the arrangements differ, in particular with regard to the practical achievability, the position and the size of the range within which the input impedance can be varied, the size and the number of stages in which the input impedance can be changed, the variation of the input impedance/correcting variable characteristic, the current gain, and the loading effect on other properties of the read amplifier.

The arrangement that is optimum for the respective application depends on the respective situation. Without exception, however, the arrangements that are described above and that are similarly constructed are extremely suitable for use in read amplifiers. In this application, they preferably form the first one of two or more amplifier stages. The second and/or further amplifier stages provide a (further) current amplification and a current/voltage conversion. Read amplifiers constructed in this way are current amplifiers with current/voltage converters at the output. However, it is also possible to immediately subject the currents that are output by the arrangements described above, i.e. without (further) current amplification, to a current/voltage conversion and to amplify the voltage obtained in this way. In both cases, the read amplifiers supply a voltage as the output signal, the magnitude of which represents the content of the memory cell read out.

Another read amplifier that also does not have the disadvantages criticized in conventional read amplifiers (particular the read amplifiers known from U.S. Pat. No. 5,253,137) is shown in FIG. 31 and will be described in the text which follows.

Figure 31:
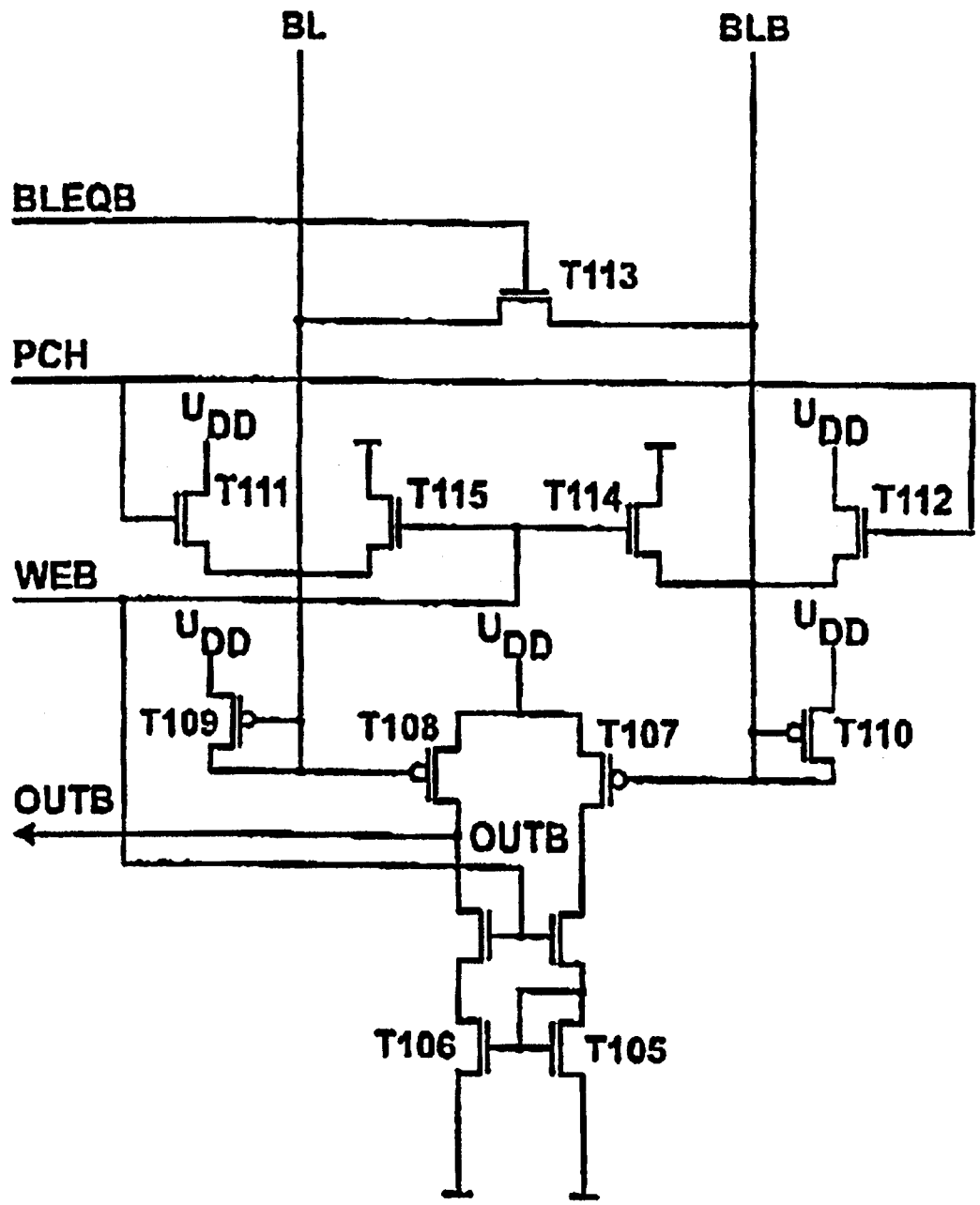

The read amplifier shown in FIG. 31 is distinguished by, among other things, an input having one or more transistors connecting the line(s), through which the current to be detected flows, to one or both terminals of a voltage source.

In the example considered, the transistors that connect the bit lines BL and BLB to the terminals of a voltage source are NMOS transistors T111 and T115 (for the bit line BL) and NMOS transistors T112 and T114 (for the bit line BLB). The respective drain terminals of these transistors are connected to the bit lines BL (transistors T111 and T115) and BLB (transistors T112 and T114), respectively, and their source terminals are connected to the positive terminal of a voltage source (transistors T111 and T112) and to the negative terminal of the voltage source (transistors T114 and T115), respectively. In the example considered, the voltage source is the supply voltage source supplying the memory chip with energy. In the example considered, the positive terminal of the voltage source is connected to the supply potential $U_{DD}$, and the negative terminal of the voltage source is connected to ground potential. A signal PCH is applied to the gate terminals of the transistors T111 and T112 and a signal WEB is applied to the gate terminals of the transistors T114 and T115. During the read out of a memory cell, the signals PCH and WEB assume values that place the transistors T111, T112, T114 and T115 into the conductive state. As a result, a potential $U_{DD}-U_{th}$ ($U_{th}$ being the threshold voltage of the transistors) occurs on the bit lines BL and BLB. This potential is not or is only slightly influenced by the currents flowing on the bit lines BL and BLB.

The transistors connecting the bit lines BL and BLB to one of the two terminals of a voltage source (the transistors T111, T112, T114 and T115 in the example considered) form an impedance converter (a first amplifier stage) of the read amplifier.

Such an impedance converter is found to be advantageous in two respects. On the one hand, it enables a read amplifier equipped with it to have a very low positive input impedance without using signal feedback (the input impedance of the read amplifier is determined by the small-signal output conductance of the transistors T111, T112, T114 and T115). On the other hand, the transistors of the amplifier stage of the read amplifier following the impedance converter, which are driven by the bit lines, can be constructed as PMOS transistors. Incidentally, this also applies to the case where the transistors T114 and T115 do not exist, that is to say, when the bit lines BL and BLB are only connected via one transistor to one terminal (the positive terminal) of the voltage source. The transistors T114 and T115, however, make it possible to lower the input impedance of the read amplifier a little more than would be the case without them.

Since the impedance converter manages without feedback of signals, it does not have any problems with reliability independently of the type and practical implementation of the memory chip in which it is being used. Feedback systems can become unstable particularly if they are not adapted to the respective situations (particularly to the selection transistor and bit line resistances) like, for example, the impedance converter of the conventional read amplifier according to U.S. Pat. No. 5,253,137.

It is advantageous that the transistors connected to the bit lines are PMOS transistors since the current flowing into the associated memory cell, more accurately the current driven by strong NMOS transistors in the memory cell, can be generated with this arrangement. In the example considered, the PMOS transistors are transistors T108 and T109 (for the bit line BL) and T107 and T110 (for the bit line BLB).

The transistors T108 and T109, and T107 and T110, respectively, are interconnected together with NMOS transistors T105 and T106, as shown in FIG. 31, to form an arrangement which mirrors the currents flowing on the bit lines BL and BLB to two series-connected transistors (to the transistors T106 and T108) and outputs the potential occurring between these transistors as a signal representing the content of the memory cell to be read out. In detail, the following conditions occur in the read amplifier when a memory cell is read out. When the content of the memory cell to be read out is "0", current flows from the read amplifier to the memory cell being read out on the bit line BL. This current is mirrored into the transistor T108 via the transistor T109. I.e. a current flows through transistor T108, the direction of which corresponds to the current flowing via the bit line BL and which is proportional to the latter. In this phase, a current flow occurs on the bit line BLB in the reverse direction, i.e. a current flows from the memory cell being read out to the read amplifier. This current is mirrored into the transistor T106 via the transistors T107 and T105. I.e. a current flows through the transistor T106, the direction of which corresponds to the current flowing via the bit line BLB and which is proportional to the latter. Thus different currents, namely the currents flowing through the transistors T106 and T108, flow to the node OUTB located between the transistors T106 and T108. In the example considered (memory cell content of "0"), the current flowing through the transistor T108 is greater than the current flowing through the transistor T106. As a result, a potential close to $U_{DD}$ occurs at the node OUTB. In the reverse case, i.e. when the content of the memory cell to be read out is "1", the conditions described are reversed. As a consequence, a potential close to ground potential then occurs at the node OUTB. Thus, the potential at the node OUTB represents an information item about the content of the memory cell to be read out.

In the example considered, one NMOS transistor is also provided between the transistors T106 and T108 and between the transistors T105 and T107. These NMOS transistors are of no significance for reading out the memory cells. They are driven by the aforementioned signal WEB in such a manner that they conduct during the reading out of memory cells and are otherwise turned off. These transistors prevent shunt currents from flowing in the relevant amplifier stage of the read amplifier at times outside the reading-out of memory cells.

Apart from the functions already described, the transistors T109 to T112 have the additional function of restoring the bit line potential after writing to memory cells. This process can be accelerated by temporarily switching on an NMOS transistor T113 provided between the bit lines BL and BLB.

Using read amplifiers of the type described last with reference to FIG. 31 allows the particularly simple creation of memory devices which can be made small under all circumstances, have a low energy requirement and operate at a rapid rate.

Read amplifiers constructed as described or differently can also be used in the decoding device which determines and selects, from a (memory cell) address applied to the memory chip, the memory cell defined by this address for reading out or writing to. The use of read amplifiers in decoding devices is particularly advantageous if the relevant decoding device has a number of cooperating decoding units that are provided more or less far apart from one another.

For example, a number of decoding units are used for determining and selecting the memory cell row in which the memory cell being read out or being written to is located. The memory cell row is selected by applying a corresponding potential to the word line associated with the relevant memory cell row.

In a decoding device having a number of cooperating decoding units, a read amplifier can be used for receiving, detecting and forwarding (amplified) the signals transmitted between the decoding units.

Differently from before, the signals transmitted between the decoding units can then have relatively low power as a result of which the drivers transmitting the signals can also be relatively weak and thus use a smaller area, consume less energy and cause fewer electromagnetic disturbances.

Figure 32:
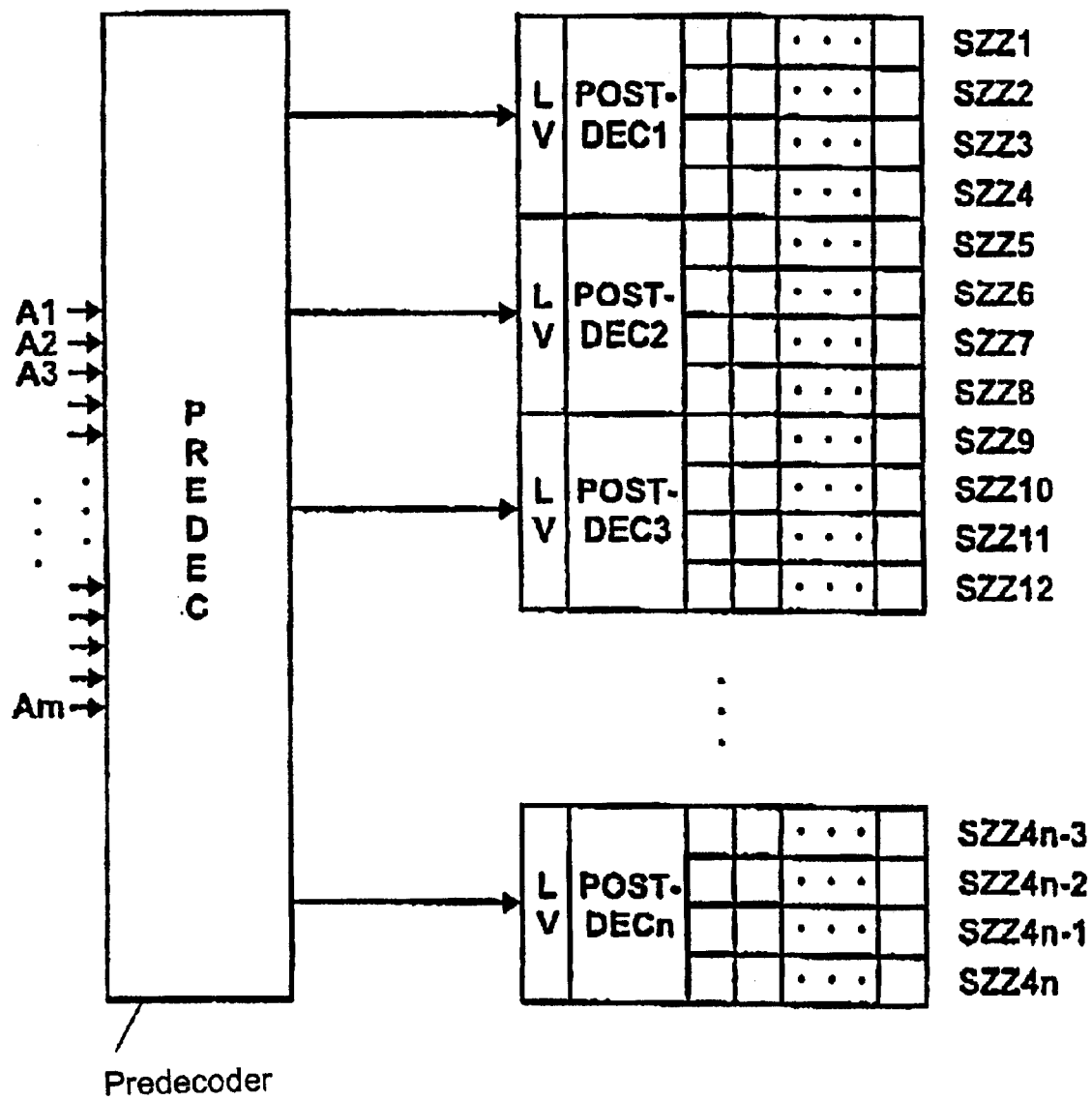

A decoding device that advantageously uses one or more read amplifiers is a decoding device having a part that is responsible for determining and selecting the memory cell row. This part is subdivided into a so-called pre-decoder and a number of so-called post-decoders. Such a decoding device is shown in FIG. 32.

In this figure, the pre-decoder is designated by the reference symbol PREDEC and the post-decoders are designated by the reference symbols POSTDEC1 to POSTDECn.

As is already indicated by the designation, the pre-decoder PREDEC performs pre-decoding of the address signals A1 to Am supplied to it. As a result, the pre-decoder PREDEC supplies a memory cell row area (including a number of memory cell rows) in which the memory cell to be read out or to be written to is located.

The post-decoders finish the decoding begun by the pre-decoder. More accurately, they define the memory cell row of the memory cell row area in which the memory cell being read out or being written to is located. The memory cell row area that is determined by the pre-decoder defines which one of the post-decoders is addressed. For each memory cell row area, a separate post-decoder is provided (in the example considered, the post-decoder POSTDEC1 for a memory cell row area including the memory cell rows SZZ1 to SZZ4, the post-decoder POSTDEC2 for a memory cell row area including the memory cell rows SZZ5 to SZZ8, etc.).

Subdividing the decoding device into pre-decoders and post-decoders is found to be advantageous because, as a result, the chip area covered by the decoding device is reduced and the performance of the decoding device increases.

In the post-decoders POSTDEC1 to POSTDECn, a read amplifier LV is in each case provided which receives and forwards, possibly amplified, signals and/or data obtained by the pre-decoder. As a result, the signals and/or data transmitted by the pre-decoder can be transmitted with relatively low power.

Read amplifiers constructed and used as described make it possible for memory devices to be achieved which are small under all circumstances, have little energy requirement and operate reliably and rapidly.

We claim:

1. A memory device, comprising:
   a plurality of memory cells for storing data; and
   a read amplifier for determining the data of a relevant one of said plurality of said memory cells by evaluating a characteristic of a current flowing between said relevant one of said plurality of said memory cells and said read amplifier;
   said characteristic being selected from the group consisting of a magnitude of said current and a direction of said current; and
   said read amplifier having a variable input impedance.

2. The memory device according to claim 1, wherein:
   said read amplifier has components with dimensions; and
   said input impedance of said read amplifier can be varied by varying said dimensions of selected ones of said components of said read amplifier.

3. The memory device according to claim 1, wherein:
   said read amplifier has components;
   said read amplifier has a drive for selected ones of said components; and
   said input impedance of said read amplifier can be varied by varying said drive.

4. The memory device according to claim 1, wherein:
   said read amplifier includes an input and a symmetrically constructed amplifier stage having two identically configured amplifier branches connected to said input.

5. The memory device according to claim 4, wherein:
   each one of said amplifier branches has a transistor operated in a common-gate configuration and a load resistor following said transistor.

6. The memory device according to claim 4, wherein:
   each one of said amplifier branches includes an input and a transistor connecting said input to ground.

7. The memory device according to claim 4, comprising:
   further amplifier branches constructed complementary to each other;
   each one of said further amplifier branches connected in parallel with a respective one of said amplifier branches at said input.

8. The memory device according to claim 1, wherein:
   said read amplifier includes an input and an asymmetrically constructed amplifier stage having two complementary configured amplifier branches connected to said input.

9. The memory device according to claim 8, wherein:
   each one of said amplifier branches has a transistor operated in a common-gate configuration and a load resistor following said transistor.

10. The memory device according to claim 8, wherein:
    each one of said amplifier branches includes an input and a transistor connecting said input to ground.

11. The memory device according to claim 8, comprising:
    further amplifier branches constructed complementary to each other;
    each one of said further amplifier branches connected in parallel with a respective one of said amplifier branches at said input.

12. The memory device according to claim 1, wherein:
    said read amplifier includes an input and an asymmetrically constructed amplifier stage having only one amplifier branch connected to said input.

13. The memory device according to claim 12, wherein:
    said amplifier branch has a transistor operated in a common-gate configuration and a load resistor following said transistor.

14. The memory device according to claim 12, wherein:
    said amplifier branch includes an input and a transistor connecting said input to ground.

15. The memory device according to claim 12, comprising:
    a further amplifier branch constructed complementary to said amplifier branch;
    said further amplifier branch connected in parallel with said amplifier branch at said input.

16. The memory device according to claim 1, wherein:
    said read amplifier includes an input and an amplifier stage having two amplifier branches connected to said input;
    each one of said amplifier branches has a transistor operated in a common gate configuration and a load resistor following said transistor.

17. The memory device according to claim 16, wherein:
    said transistor in each one of said amplifier branches has a gate terminal receiving a voltage acting to vary said input impedance of said read amplifier.

18. The memory device according to claim 17, wherein:
    said read amplifier has adjustable components; and
    said voltage applied to said gate terminal of said transistor in each one of said amplifier branches can be varied by adjusting said adjustable components.

19. The memory device according to claim 17, wherein:
    said read amplifier has components; and
    said voltage applied to said gate terminal of said transistor in each one of said amplifier branches can be varied by appropriately dimensioning said components.

20. The memory device according to claim 16, comprising:
    coupling branches;
    each one of said coupling branches providing a voltage from one of said amplifier branches;
    said transistor in each one of said amplifier branches having a gate terminal receiving said voltage from a respective one of said coupling branches.

21. The memory device according to claim 16, comprising:
    a voltage divider providing voltages;
    coupling branches;

said transistor in each one of said amplifier branches having a gate terminal; and said coupling branches applying a respective one of said voltages from said voltage divider to said gate terminal of said transistor in each one of said amplifier branches.

22. The memory device according to claim 21, wherein: said load resistor is formed by a CMOS voltage divider.

23. The memory device according to claim 21, wherein: said voltage divider is formed by a CMOS voltage divider.

24. The memory device according to claim 16, wherein: said load resistor is constructed to provide various voltages.

25. The memory device according to claim 16, wherein: said load resistor is formed by a resistor that can be tapped at a plurality of points.

26. The memory device according to claim 16, wherein:
said load resistor is formed by a diode-connected transistor and a transistor that forms a load resistor; and
said transistor that forms said load resistor is connected in series with said diode-connected transistor.

27. The memory device according to claim 16, comprising:
coupling branches for controlling said transistor in each one of said amplifier branches;
each one of said coupling branches including a voltage amplifier selected from the group consisting of an inverting amplifier and a non-inverting amplifier.

28. The memory device according to claim 27, wherein: said voltage amplifier is formed by a load resistor followed by a transistor operated in a common-gate configuration.

29. The memory device according to claim 27, wherein: said voltage amplifier is formed by a load resistor followed by a transistor operated in a common-source connection.

30. The memory device according to claim 16, wherein: said resistor is formed by a transistor.

31. The memory device according to claim 1, comprising:
voltage dividers; and
coupling branches;
said read amplifier including an input and an amplifier stage having two amplifier branches connected to said input;
said voltage dividers located between said amplifier branches, said voltage dividers having inversely acting taps; and
each one of said amplifier branches having a transistor with a gate terminal receiving a voltage from one of said taps of said voltage dividers.

32. The memory device according to claim 1, wherein:
said read amplifier includes an amplifier stage that has two amplifier branches;
each one of said amplifier branches includes an input and a transistor that connects said input to ground; and
said transistor has a gate terminal that receives a voltage from one of said amplifier branches.

33. A memory device, comprising:
a plurality of memory cells for storing data;
a read amplifier for determining the data of a relevant one of said plurality of said memory cells by evaluating a characteristic of a current flowing between said relevant one of said plurality of said memory cells and said read amplifier, said characteristic being selected from the group consisting of a magnitude of said current and a direction of said current;
a line through which said current flows; and
at least one transistor for connecting said line to at least one terminal of a voltage source.

34. A memory device, comprising:
a plurality of memory cells for storing data; and
a decoding device having at least two mutually cooperating decoding units for selecting ones of said plurality of said memory cells;
at least a first one of said decoding units including a read amplifier; and
said read amplifier for performing an operation selected from the group consisting of receiving, evaluating, and forwarding information selected from the group consisting of data from at least a second one of said decoding units and signals from at least said second one of said decoding units.

* * * * *